United States Patent [19]
Isogai et al.

[11] Patent Number: 5,942,774
[45] Date of Patent: Aug. 24, 1999

[54] PHOTOELECTRIC CONVERSION ELEMENT AND PHOTOELECTRIC CONVERSION APPARATUS

[75] Inventors: Tadao Isogai, Yokohama; Atsushi Kamashita, Kawasaki; Satoshi Suzuki, Yokohama, all of Japan

[73] Assignee: Nikon Corporation, Tokyo, Japan

[21] Appl. No.: 08/606,995

[22] Filed: Feb. 26, 1996

[30] Foreign Application Priority Data

Feb. 24, 1995 [JP] Japan ................................. 7-060034
Feb. 21, 1996 [JP] Japan ................................. 8-033833

[51] Int. Cl.$^6$ ................................................ H01L 27/146
[52] U.S. Cl. ........................ 257/292; 257/257; 257/258; 257/435; 257/445; 257/446; 257/448
[58] Field of Search ................................... 257/292, 256, 257/257, 258, 272, 435, 443, 446, 445, 448, 461; 358/482

[56] References Cited

U.S. PATENT DOCUMENTS

| | | | |
|---|---|---|---|
| 4,942,474 | 7/1990 | Akimoto et al. | 358/213.11 |
| 4,949,152 | 8/1990 | Asano et al. | 257/294 |
| 5,043,783 | 8/1991 | Matsumoto et al. | 357/30 |
| 5,172,249 | 12/1992 | Hashimoto | 358/482 |
| 5,309,013 | 5/1994 | Suzuki et al. | 257/446 |
| 5,404,039 | 4/1995 | Watanabe | 257/230 |
| 5,471,515 | 11/1995 | Fossum et al. | 377/60 |
| 5,563,429 | 10/1996 | Isogai | 257/258 |
| 5,604,364 | 2/1997 | Ohmi et al. | 257/291 |
| 5,625,210 | 4/1997 | Lee et al. | 257/292 |

FOREIGN PATENT DOCUMENTS 5-235317  9/1993  Japan .
5-275670  10/1993  Japan .

Primary Examiner—John Guay
Attorney, Agent, or Firm—Foley & Lardner

[57] ABSTRACT

A photoelectric conversion element includes a photoelectric conversion portion for generating and storing a charge according to incident light, an amplifying portion having a control region for generating a signal output according to the charge received in the control region from the photoelectric conversion portion, a transfer control portion for transferring the charge generated and stored in the photoelectric conversion portion to the control region of the amplifying portion, a reset-purpose charge draining region for draining the charge transferred to the control region of the amplifying portion, and a reset-purpose control region for controlling the reset-purpose charge draining region. A reset operation can be performed without operating the amplifying portion. Also, a photoelectric conversion apparatus having high sensitivity and low dissipation power can be obtained.

9 Claims, 14 Drawing Sheets

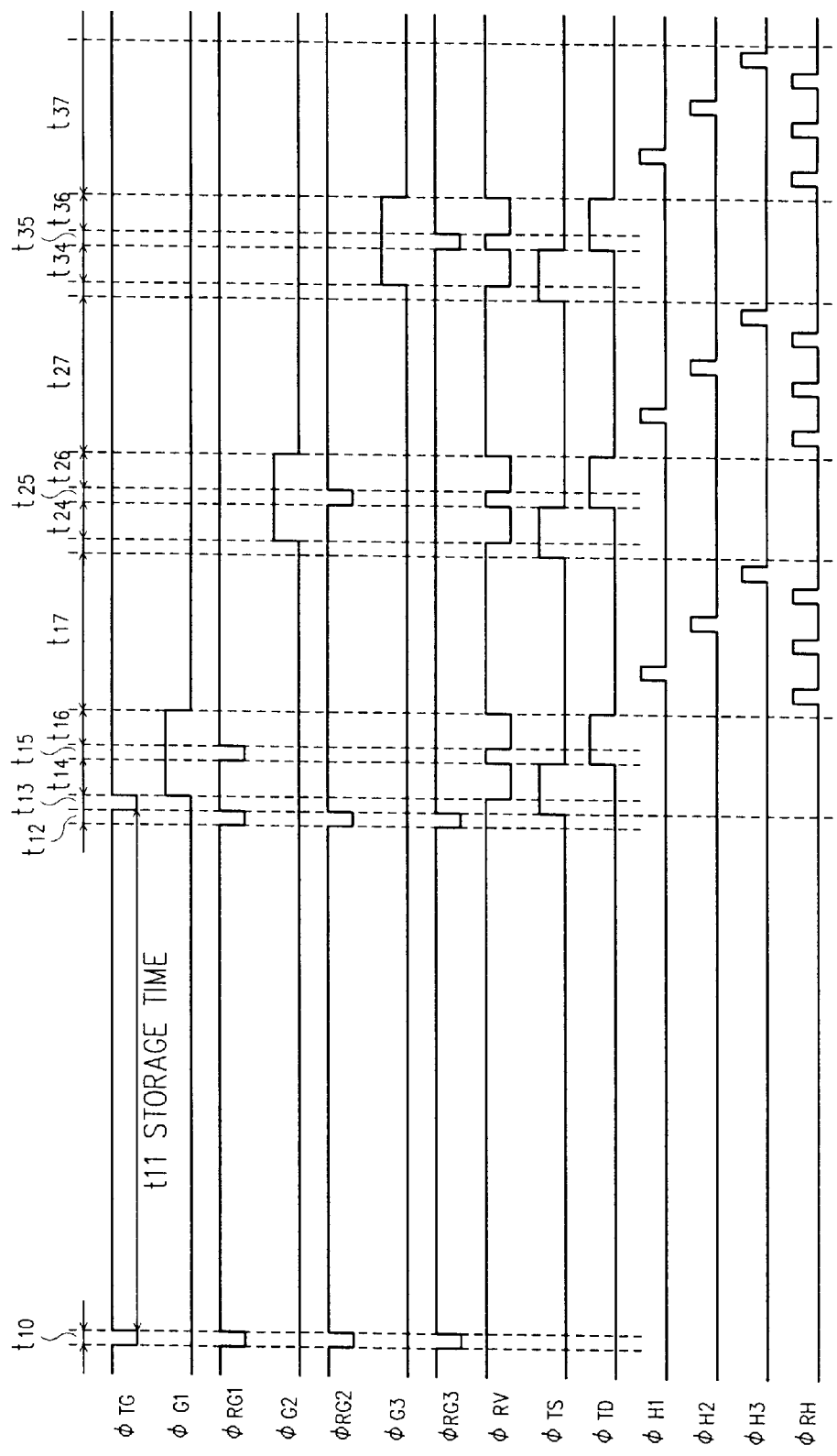

PHOTOELECTRIC CONVERSION ELEMENT AND PHOTOELECTRIC CONVERSION APPARATUS

BACKGROUND OF THE INVENTION

1. Field of the Invention

The present invention relates to photoelectric conversion elements and photoelectric conversion apparatus, and more particularly to photoelectric conversion elements that can perform a reset operation without operating an amplifying portion, and photoelectric conversion apparatus that can perform a high-speed reset operation.

2. Related Background Art

The conventional photoelectric conversion elements of an amplification type utilizing transistors, proposed in order to enhance the sensitivity of photoelectric conversion apparatus (including solid state image sensing devices etc.), include MOS type (normally, depletion MOS type) devices, bipolar type devices, and junction field effect transistor (JFET) type devices. In these photoelectric conversion elements, when light impinges on a MOS diode (of the MOS type) or on a pn junction diode (of the bipolar type or the JFET type), which is a part of constituent elements forming a photoelectric conversion element, the incident light is photoelectrically converted into a charge according thereto, the charge is stored, a signal according to the stored charge is amplified (in current amplification or in charge amplification), and then the amplified signal is output.

Among the above photoelectric conversion elements some photoelectric conversion elements are arranged to perform all operations including the photoelectric conversion operation, amplification operation, and initialization operation with a single transistor (which means that a photoelectric conversion element is composed of a single transistor). The photoelectric conversion elements of this type have two significant problems. Here, the initialization operation means an operation for setting the potential of a control region of the transistor to a certain reference value or an operation to completely deplete the control region. The control region of the transistor is a region for controlling the current, for example, which is a gate diffusion region in the JFET or a base diffusion region in the bipolar transistor.

The first problem is an increase of noise in the photoelectric conversion portion. For example, in the case of the MOS type device, photoelectric conversion is normally provided by a MOS diode with a gate electrode of polysilicon. In this case, since the silicon surface side is depleted at that point, it is directly affected by a great dark current appearing on the surface, resulting in increasing the noise. It also had the problem of a low utilization factor (quantum efficiency) of light because polysilicon has low transmittance of light.

The bipolar type and JFET type devices effecting photoelectric conversion by the pn junction diode are also affected by the dark current. This is because an ideal diode structure such as a buried photodiode suitably employed in a CCD image pickup element or the like cannot be realized because of the restriction that a part of the constituent elements of the transistor is utilized (which means that, in the case of the bipolar type and JFET type devices, a depletion layer occurring from the pn junction portion reaches the surface). Therefore, the noise becomes great because of the dark current.

Normally, these pn junction diodes perform such reset operation as to recombine the charge generated and stored, by transient and considerably deep forward bias drive by capacitive coupling. However, this reset method will cause the problem of occurrence of reset noise and after-image (lag).

A further problem is that when the charge generated and stored was reset and when blooming (bleeding) suppressing operation was carried out, the transistor also operated (or became "on"), and a large current flowed in the transistor itself constituting the photoelectric conversion element, which greatly changed the bias point (operating point) of the transistor transiently to change the amplification factor. For example, when a photoelectric conversion apparatus is composed of a lot of such photoelectric conversion elements arrayed, there occur variations in outputs from the photoelectric conversion elements, causing problems of the lowering the performance of apparatus (for example, S/N ratios) and increasing dissipation power because of the many arrayed elements.

The second problem is that the sensitivity is limited. To begin with, the above various (MOS type, bipolar type, and JFET type) transistors (photoelectric conversion elements) utilize a potential change caused when the charge generated by photoelectric conversion is stored in the control region in a floating state, in order to effect current amplification or charge amplification. Namely, they obtain an amplified output by utilizing a change of the surface potential of silicon under the gate electrode, in the case of the depletion MOS type transistor, or a potential change of the base region in the case of the bipolar device or of the gate region, in the case of the JFET type device.

Accordingly, in order to achieve high sensitivity, it is necessary to increase an amount of this potential change (stored charge amount/capacitance). For that purpose, the capacitance of the control region is preferably as small as possible. However, the area of the photoelectric conversion portion (a light-receiving aperture ratio) needs to be increased in order to raise the utilization factor of incident light and thereby increase the charge amount. However, in the case of the photoelectric conversion element where only one transistor performs the all operations (including the photoelectric conversion operation, the amplification operation, and the initialization operation), the control region is nothing but the photoelectric conversion portion, and, therefore, the capacitance becomes greater with an increase of the aperture ratio. As a result, the sensitivity is limited.

Also proposed on the other hand are photoelectric conversion elements arranged in such a manner that the photoelectric conversion portion is separated from an amplifying transistor, the charge generated and stored in the photoelectric conversion portion is transferred through a transfer gate of a transfer control portion to the control region of the transistor, and an output is obtained by current amplification or charge amplification. For example, Japanese Patent Laid-open Nos. 5-235317 (corresponding to U.S. patent application Ser. No. 08/261,135) and 5-275670 disclose photoelectric conversion elements in which the amplifying portion of the depletion type MOS transistor or the JFET is combined with the photodiode and the transfer control portion (transfer gate).

In the photoelectric conversion elements arranged by separating the photoelectric conversion portion from the amplifying transistor and providing the transfer gate, as described above, if a buried photodiode is used for the photoelectric conversion portion, the photoelectric conversion elements can be achieved with high quantum efficiency and without occurrence of lag, dark current, or reset noise.

When a buried photodiode in a vertical overflow structure is used for the photoelectric conversion portion, the blooming suppressing operation by the amplifying transistor becomes unnecessary, because the photodiode has a blooming suppressing function. For example, when a photoelectric conversion apparatus is composed of such photoelectric conversion elements, the apparatus is free of the problem of increase of dissipation power and the problem that variations appear in outputs from the photoelectric conversion elements due to changes of bias points (operating points).

Further, because the photoelectric conversion portion is separated from the amplifying transistor, the structure and size of the transistor can be optimized by taking only the amplifying function into consideration. Therefore, high sensitivity can be secured by decreasing the capacitance of the control region.

In addition, the new problems including the dark current, lag, and reset noise, caused by the transistor itself, can effectively be removed by the configuration and drive method of the photoelectric conversion apparatus with these photoelectric conversion elements arranged in a matrix.

Thus, the photoelectric conversion element with the separate photoelectric conversion portion and amplifying transistor and with the transfer gate is considerably lowered in noise and enhanced in sensitivity, as compared with the photoelectric conversion element arranged to perform all operations (including the photoelectric conversion operation, the amplification operation, and the initialization operation) by a transistor.

However, the above conventional photoelectric conversion element (which is the photoelectric conversion element provided with the separate photoelectric conversion portion and amplifying transistor and the transfer gate) had the problem that there is no improvement in the reset operation compared to the other conventional photoelectric conversion element arranged to perform the all operations by a single transistor.

Namely, the conventional photoelectric conversion element (the photoelectric conversion element with the separate photoelectric conversion portion and amplifying transistor and the transfer gate) also had the problem that when the reset operation was started in order to initialize the control region of the transistor, the amplifying transistor itself also operated (or became "on") at the same time therewith.

As a result, a large current flows in the amplifying transistor, which greatly changes the bias point (operating point) of the amplifying transistor transiently, thereby changing the amplification factor. For example, when a photoelectric conversion apparatus was composed of a lot of photoelectric conversion elements of this type arrayed, there were problems that variations appeared in outputs from the photoelectric conversion elements, that the performance of the apparatus (for example, S/N ratios) was degraded, and that the dissipation power increased because of the array of many elements.

SUMMARY OF THE INVENTION

The present invention has been developed in view of the above circumstances, and an object thereof is to obtain a photoelectric conversion element capable of performing the reset operation without operating the amplifying portion.

Another object of the present invention is to obtain a photoelectric conversion element that can suppress occurrence of fixed pattern noise.

Still another object of the present invention is to obtain a photoelectric conversion element that can improve the aperture ratio and the degree of integration.

Still another object of the present invention is to obtain a photoelectric conversion element that can suppress the phenomenon of blur such as blooming due to obliquely incident light.

Still another object of the present invention is to obtain a photoelectric conversion element that can attain ideal characteristics such as suppressing the dark current, lag, and reset noise.

Still another object of the present invention is to obtain a photoelectric conversion element that can enhance the sensitivity.

A further object of the present invention is to obtain a photoelectric conversion apparatus that can suppress the degradation of performance (for example, S/N ratios) of the apparatus and the increase of dissipation power, as accomplished under the above circumstances.

Still another object of the present invention is to obtain a photoelectric conversion apparatus that can perform a high-speed reset operation.

Still another object of the present invention is to obtain a photoelectric conversion apparatus that can attain signal outputs according to only photogenerated charge components.

One aspect of the present invention is a photoelectric conversion element comprising: a photoelectric conversion portion for generating a charge according to incident light and storing the charge therein; an amplifying portion having a control region for generating a signal output according to the charge received in the control region from said photoelectric conversion portion; a transfer control portion for transferring the charge generated and stored in the photoelectric conversion portion to the control region of the amplifying portion; reset-purpose charge draining means for draining the charge transferred to the control region of the amplifying portion; and reset-purpose control means for controlling the reset-purpose charge draining means.

Here, the photoelectric conversion portion generates the charge according to the incident light and stores it. The amplifying portion generates the signal output according to the charge received by the control region. The transfer control portion transfers the charge generated and stored in the above photoelectric conversion portion to the control region of the above amplifying portion. The reset-purpose charge draining means drains the charge transferred to the control region of the above amplifying portion. The reset-purpose control means controls the above reset-purpose charge draining means.

Namely, in the case of the conventional photoelectric conversion elements, when the reset operation is carried out in order to initialize the control region of the amplifying portion (or to eliminate the charge (signal charge) remaining in the control region), the amplifying portion itself is operated (or turned on) and thus, for example, a large current flows in the amplifying portion itself, which causes the problem that the amplifying factor changes because of large transient fluctuations of the bias point (operating point) of the amplifying portion.

Since in the present invention the reset-purpose charge draining means and the reset-purpose control means for initializing the control region of the amplifying portion are formed separately and independently, the amplifying portion does not operate upon the reset operation. This can solve the problem that the large current flows in the amplifying portion itself by the reset operation and it causes the amplification factor to change because of transient great fluctuations of the bias point (operating point) of the amplifying portion as in the conventional photoelectric conversion elements.

Generally, the above amplifying portion often comprises control means for controlling the control region of the amplifying portion by capacitive coupling. However, without provision of this control means, wiring to the control means is not necessary, fabrication is easy, the capacitance of the control region of the amplifying portion can be smaller by that degree of no provision of control means, and the sensitivity can be enhanced.

Another aspect of the present invention is the photoelectric conversion element further comprising the control means for controlling the control region of the amplifying portion by capacitive coupling.

Namely, the amplifying portion of the photoelectric conversion element often has the control means for controlling the control region of the amplifying portion by capacitive coupling. Also in the case of the photoelectric conversion element provided with the control means, the amplifying portion does not operate upon the reset operation by forming the reset-purpose charge draining means and reset-purpose control means for initializing the control region of the amplifying portion separately and independently from the amplifying portion. Thus, this arrangement can solve the problem that the large current flows in the amplifying portion itself by the reset operation and this causes the amplification factor to change because of large transient fluctuations of the bias point (operating point) of the amplifying portion.

Still another aspect of the present invention is the photoelectric conversion element wherein the amplifying portion is comprised of a field effect transistor (FET).

Namely, the above amplifying portion preferably can suppress generation of fixed pattern noise based on signal (charge) destruction. For that purpose, the amplifying portion is preferably constructed of a field effect transistor (FET) for amplifying the charge (signal charge) generated and stored in the photoelectric conversion portion on a non-destructive basis.

Still another aspect of the present invention is the photoelectric conversion element wherein an element isolation region of a predetermined conductivity type is formed between mutual regions of the photoelectric conversion portion, the amplifying portion, the transfer control portion, the reset-purpose charge draining means, and the reset-purpose control means.

The clearances of the mutual regions between the above photoelectric conversion portion, amplifying portion, transfer control portion, reset-purpose charge draining region, and reset-purpose control means are generally desired to be formed as small as possible in view of the aperture ratio and the degree of integration. However, it is difficult to make the clearances of the mutual regions small, because of the influence of so-called side diffusion of dopant (impurity) in the fabrication process of the photoelectric conversion element.

Accordingly, the aperture ratio and the degree of integration can be improved by forming the element isolation region of the predetermined conductivity type between the mutual regions of the photoelectric conversion portion, amplifying portion, transfer control portion, reset-purpose charge draining means, and reset-purpose control means whereby the above clearances of the mutual regions can be formed as small as possible.

Still another aspect of the present invention is the photoelectric conversion element wherein a metal interconnection connected to the reset-purpose charge draining means is formed of a light-shielding film for shielding incident light to the amplifying portion, the transfer control portion, the reset-purpose charge draining means, and the reset-purpose control means.

Namely, the metal interconnection also serves as a light-shielding film. It thus becomes unnecessary to form an extra light-shielding film for shielding the incident light, and it becomes possible to decrease the thickness of the entire photoelectric conversion element. Also, it becomes possible to improve the degree of integration, and to set the metal wiring and light-shielding film in the vicinity of the photoelectric conversion portion, thereby suppressing the phenomenon of bleeding such as blooming due to obliquely incident light.

Still another aspect of the present invention is the photoelectric conversion element wherein the photoelectric conversion portion is comprised of a pn junction photodiode of a vertical overflow structure.

Namely, also in the photoelectric conversion element in which the reset-purpose charge draining means and reset-purpose control means are provided separately and independently of the amplifying portion, the photoelectric conversion portion can be formed of the pn junction photodiode of the vertical overflow structure. Then the phenomenon of bleeding such as blooming and smear can be suppressed by constructing the photoelectric conversion portion of the pn junction photodiode of the vertical overflow structure.

Still another aspect of the present invention is the photoelectric conversion element wherein the photoelectric conversion portion is comprised of a buried photodiode of the vertical overflow structure.

Namely, also in the photoelectric conversion element provided with the reset-purpose charge draining means and reset-purpose control means separate and independent of the amplifying portion, the photoelectric conversion portion can be comprised of the buried photodiode of the vertical overflow structure. The ideal characteristics to suppress the bleeding phenomenon such as blooming and smear and to suppress the dark current, lag, and reset noise can be attained by forming the photoelectric conversion portion of the buried photodiode of the vertical overflow structure.

Still another aspect of the present invention is the photoelectric conversion element wherein the amplifying portion is comprised of a junction field effect transistor (JFET) and wherein a channel forming portion of the junction field effect transistor is formed of a first conductivity type gate region, a second conductivity type channel region, and a first conductivity type semiconductor substrate in the order from the semiconductor surface toward the inside of the semiconductor substrate.

Namely, the amplifying portion of the photoelectric conversion element may also be formed of the junction field effect transistor (JFET) and the channel forming portion of this junction field effect transistor (JFET) may be constructed of the first conductivity type gate region, the second conductivity type channel region, and the first conductivity type semiconductor substrate in the order from the semiconductor surface toward the inside of the semiconductor substrate. Accordingly, in amplifying the charge (signal charge), the charge (signal charge) is amplified through the first conductivity type gate region and the second conductivity type channel region.

Still another aspect of the present invention is the photoelectric conversion element wherein the amplifying portion is comprised of a junction field effect transistor (JFET) and wherein a channel forming portion of the junction field effect transistor (JFET) is formed of a first conductivity type shallow gate region, a second conductivity type shallow channel region, a first conductivity type gate region, a second conductivity type well region, and a first conductivity type semiconductor substrate in the order from the semiconductor surface toward the inside of the semiconductor substrate.

Namely, the amplifying portion of the photoelectric conversion element may be constructed of a junction field effect transistor (JFET), and the channel forming portion of this junction field effect transistor (JFET) is formed of the first conductivity type shallow gate region, the second conductivity type shallow channel region, the first conductivity type gate region, the second conductivity type well region, and the first conductivity type semiconductor substrate in the order from the semiconductor surface toward the inside of the semiconductor substrate.

Describing in more detail, the channel forming portion is shallowed (in shallow junction arrangement) by the first conductivity type shallow gate region and the second conductivity type shallow channel region so as to reduce the size of the entire junction field effect transistor. Also, the first conductivity type gate region and the first conductivity type semiconductor substrate are electrically separated by interposition of the second conductivity type well region between the first conductivity type gate region and the first conductivity type semiconductor substrate.

The shallowing improves transconductance, and the reduction of size increases the degree of integration and the aperture ratio and makes it possible to raise the sensitivity. The electric isolation between the gate (control region) and the semiconductor substrate of the junction field effect transistor (JFET) can make it possible to suppress the influence of substrate voltage (substrate bias effect) and to raise the amplification factor upon current amplification operation and the charge amplification factor upon source-follower operation.

Still another aspect of the present invention is the photoelectric conversion element wherein the amplifying portion is comprised of a junction field effect transistor (JFET), wherein a channel forming portion of the junction field effect transistor (JFET) is formed of a first conductivity type shallow gate region, a second conductivity type shallow channel region, a first conductivity type gate region, a second conductivity type well region, and a first conductivity type semiconductor substrate in the order from the semiconductor surface toward the inside of the semiconductor substrate, and wherein the first conductivity type shallow gate region and the first conductivity type gate region are electrically connected with each other in a portion other than the channel forming portion.

Namely, the amplifying portion of the photoelectric conversion element may be formed of the junction field effect transistor (JFET), wherein the channel forming portion of the junction field effect transistor (JFET) is constructed of the first conductivity type shallow gate region, the second conductivity type shallow channel region, the first conductivity type gate region, the second conductivity type well region, and the first conductivity type semiconductor substrate in the order from the semiconductor surface toward the inside of the semiconductor substrate. The first conductivity type shallow gate region and the first conductivity type gate region are electrically connected with each other in the portion other than the channel forming portion.

Accordingly, the shallowing improves the transconductance, and the reduction of size can increase the degree of integration and the aperture ratio and enhance the sensitivity by that degree. The arrangement in which the first conductivity type shallow gate region and first conductivity type gate region are made electrically connected and in which the gate (control region) of the junction field effect transistor (JFET) and the semiconductor substrate are electrically separated can make it possible to greatly suppress the influence of substrate voltage (substrate bias effect) and to increase the amplification factor during the current amplification operation or the charge amplification factor during the source-follower operation.

Still another aspect of the present invention is the photoelectric conversion element wherein the photoelectric conversion portion is a buried photodiode of a vertical overflow structure, wherein the amplifying portion is comprised of a junction field effect transistor and a channel forming portion of the junction field effect transistor is formed of a first conductivity type shallow gate region, a second conductivity type shallow channel region, a first conductivity type gate region, a second conductivity type well region, and a first conductivity type semiconductor substrate in the order from the semiconductor surface toward the inside of the semiconductor substrate, wherein the first conductivity type shallow gate region and the first conductivity type gate region are electrically connected with each other in a portion other than the channel forming portion, and wherein an impurity concentration of the first conductivity type gate region is different from an impurity concentration of a charge storing portion of the buried photodiode. This enables operation of the buried photodiode and the junction field effect transistor under suitable conditions.

Still another aspect of the present invention is the photoelectric conversion element wherein the impurity concentration of the first conductivity type gate region is in the range of $6\times10^{15}$ cm$^{-3}$ to $3\times10^{16}$ cm$^{-3}$ and the impurity concentration of the charge storing portion of the buried photodiode is in the range of $5\times10^{15}$ cm$^{-3}$ to $3\times10^{16}$ cm$^{-3}$. This enables operation of the buried photodiode and the junction field effect transistor under most suitable conditions.

Still another aspect of the present invention is the photoelectric conversion element wherein the amplifying portion is comprised of a MOS field effect transistor and this field effect transistor is of a depletion type.

This enables suppression of fixed pattern noise based on signal (charge) destruction. Since neither reset noise nor lag occurs upon the reset operation of the control region of the MOS field effect transistor, this arrangement is suitable for forming a photoelectric conversion element enabling electronic shutter operation with simultaneity in a frame.

Still another aspect of the present invention is the photoelectric conversion element wherein the amplifying portion is comprised of a bipolar transistor, the bipolar transistor having a collector of a high-concentration region of a predetermined conductivity type formed in a silicon surface layer portion surrounding the photoelectric conversion element, without forming a buried collector or a collector using a high-concentration substrate of a predetermined conductivity type.

This enables construction of a combination of the bipolar transistor with the photodiode of the vertical overflow structure, which can suppress pseudo signals such as blooming or smear.

Still another aspect of the present invention is a photoelectric conversion apparatus comprising: a plurality of photoelectric conversion elements arranged in a two-dimensional matrix, each photoelectric conversion element comprising a photoelectric conversion portion for generating a charge according to incident light and storing the charge therein, an amplifying portion having a control region for generating a signal output according to the charge received in the control region from the photoelectric conversion portion, a transfer control portion for transferring the charge generated and stored in the photoelectric conversion portion to the control region of the amplifying portion, reset-purpose charge draining means for draining the charge transferred to the control region of the amplifying portion, and reset-purpose control means for controlling the reset-purpose charge draining means.

Still another aspect of the present invention is the photoelectric conversion apparatus wherein the reset-purpose charge draining means of the respective photoelectric conversion elements arrayed at least in one scanning direction are arranged in parallel to each other.

By the arrangement in which the reset-purpose charge draining means of the respective photoelectric conversion elements arrayed in the horizontal scanning direction are arranged in parallel with each other, the amplifying portion always corresponds to the reset portion in each unit pixel of the photoelectric conversion element, whereby the control region of the amplifying portion can be initialized within a very short time to the potential of the reset portion. Namely, this arrangement makes high-speed reset operation possible.

Still another aspect of the present invention is the photoelectric conversion apparatus further comprising: a vertical scanning circuit; and a pulse drive source; wherein the transfer-purpose control means of the transfer control portion and the reset-purpose charge draining means in the photoelectric conversion elements are connected commonly along the horizontal scanning direction, thereby connecting to the vertical scanning circuit for pulse driving. The reset-purpose control means in all the photoelectric conversion elements are connected commonly to the pulse drive source.

In the photoelectric conversion apparatus constructed in the above arrangement, the voltage of the high level is first applied to the reset-purpose charge draining means in a certain specific horizontal line (selected row) by the vertical scanning circuit, and the voltage of the low level is applied to the reset-purpose charge draining means in the other horizontal lines (non-selected rows). Then the drive pulse from the pulse drive source is applied to the all reset-purpose control means.

As a result, the control regions of the amplifying portions in the photoelectric conversion elements in the selected row are initialized to the voltage of the high level, and the control regions of the amplifying portions in the photoelectric conversion elements in the non-selected rows to the voltage of the low level.

Employing the arrangement in which the initializing operation of the control regions of the amplifying portions is performed by the reset-purpose charge draining means and reset-purpose control means, the apparatus can obviate a need to perform the reset operation for recombining the charge (signal charge) by driving the control regions of the amplifying portions by a forward bias as in the conventional photoelectric conversion apparatus.

Thus, the invention can solve the problems that a large current flows in the amplifying portions and that in the case of the photoelectric conversion apparatus being constructed with a lot of photoelectric conversion elements arrayed, amplification factors vary because of large transient fluctuations of bias points (operating points) of the amplifying portions to cause variations of outputs from the respective photoelectric conversion elements, thereby degrading the performance of apparatus (for example, S/N ratios) and increasing the dissipation power.

After the control regions of the amplifying portions are initialized, the drive pulse sent from the vertical scanning circuit is applied to the transfer-purpose control means given in the above photoelectric conversion elements. As a result, the charges (signal charges) generated and stored in the photoelectric conversion portions in the above photoelectric conversion elements are transferred from the above photoelectric conversion portions to the control regions of the above amplifying portions, and the amplifying portions execute the amplifying operation of the charges (signal charges).

Still another aspect of the present invention is the photoelectric conversion apparatus further comprising: a vertical scanning circuit; a pulse drive source; and a power supply; wherein the transfer-purpose controlling means of the transfer control portions and the control means for controlling the control regions of the amplifying portions by capacitive coupling in the photoelectric conversion elements are connected commonly along the horizontal scanning direction, thereby connecting to the vertical scanning circuit for pulse driving, the reset-purpose control means and the reset-purpose charge draining means in all the photoelectric conversion elements are connected commonly, thereby the reset-purpose controlling means are connected to the pulse drive source and the reset-purpose charge draining means are connected to the power source.

Namely, the above arrangement is attained when the features of the present invention are applied to the most popular arrangement of a conventional photoelectric conversion apparatus. The feature of the present invention is to form the reset-purpose charge draining means and reset-purpose control means independently in order to initialize the control regions of the amplifying portions without operating the amplifying portions. Further, another feature of the present invention is to arrange the reset-purpose charge draining means of the respective photoelectric conversion elements in parallel with each other along the horizontal scanning direction in order to achieve high-speed reset operation. Then the above arrangement enables fabrication of the photoelectric conversion apparatus with little changing the arrangement of the conventional photoelectric conversion apparatus. The fabrication becomes easy accordingly.

In the photoelectric conversion apparatus constructed in the above arrangement, the voltage is fixedly supplied from the power supply to the reset-purpose charge draining means, and the reset-purpose charge draining means supplies the voltage thus supplied to the control regions of the amplifying portions. The reset-purpose control means operates (turns on or off) according to the drive pulse sent from the pulse drive source. Here, the operation (on or off) of the above reset-purpose control means controls the voltage supplied from the reset-purpose charge draining means to the control regions of the amplifying portions.

Namely, the voltage is supplied from the reset-purpose charge draining means to the control regions of the amplifying portions in accordance with the operation (on or off) of the reset-purpose control means. Then the potential of the control regions of the amplifying portions changes to the same potential as that of the reset-purpose charge draining means, thus initializing the control regions of the amplifying portions.

Since the amplifying portions do not operate (turn on) upon the initialization operation of the amplifying portions, the invention can solve the problems that a large current flows in the amplifying portions, which causes large transient fluctuations of the bias points (operating points) of the amplifying portions, thereby changing the amplification factors and causing variations of outputs from the respective photoelectric conversion elements, that the performance (for example, S/N ratios) of the apparatus is degraded, and that the dissipation power increases because of the arrangement of many photoelectric conversion elements. Further, the present invention enables selecting or non-selecting operations of rows by using the control means for controlling the control regions of the amplifying portions by capacitive coupling.

Still another aspect of the present invention is the photoelectric conversion apparatus further comprising: a vertical scanning circuit; a pulse drive source; and a power supply; wherein the control means for controlling the control region of the amplifying portion by capacitive coupling and reset-purpose control means in the photoelectric conversion elements are connected commonly along the horizontal reading direction, thereby connecting to the vertical scanning circuit for pulse driving, the transfer-purpose controlling means of the transfer control portions and reset-purpose charge draining means in all the photoelectric conversion elements are connected commonly, thereby the transfer-purpose controlling means are connected to the pulse drive source and the reset-purpose charge draining means are connected to the power source.

When the drive pulse sent from the pulse drive source is applied to the transfer-purpose control means of the above transfer portions, the charges (signal charges) generated and stored in the photoelectric conversion portions in all the pixels are simultaneously transferred to the control regions of the amplifying portions. When the drive pulse sent from the vertical scanning circuit is applied to the control means for controlling the control regions of the above amplifying portions by capacitive coupling, the amplifying portions execute the amplification operation, and then the amplifying portions output signals amplified.

The reset-purpose control means operates (turns on or off) in accordance with the drive pulse sent from the vertical scanning circuit, and the voltage from the power supply connected to the reset-purpose charge draining means is supplied to the control regions of the above amplifying portions in accordance with this operation to turn the control regions of the amplifying portions into the same potential as that of the reset-purpose charge draining means, thus initializing the control regions of the amplifying portions.

This enables resetting of the control regions of the amplifying portions without operating (turning on) the amplifying portions, which enables suppression of the degradation of performance (for example, S/N ratios) of the apparatus and the increase of the dissipation power due to the arrangement of many photoelectric conversion elements. It is noted that the present invention enables an electronic shutter operation which is operated simultaneously in a frame.

Still another aspect of the present invention is the photoelectric conversion apparatus further comprising: a vertical scanning circuit for commonly driving the photoelectric conversion elements along the horizontal scanning direction; first memory means for storing signal outputs for one horizontal line immediately after the control regions of the amplifying portions are initialized according to vertical scanning; and second memory means for storing signal outputs for one horizontal line immediately after the charges are transferred to the control regions of the amplifying portions according to vertical scanning.

Namely, noise components are mixed in signal outputs immediately after the control regions of the amplifying portions are initialized, and charge components and noise components are mixed in signal outputs immediately after the charges (signal charges) generated and stored by the photoelectric conversion portions are transferred to the control regions of the amplifying portions.

Accordingly, a signal output immediately after the control region of each amplifying portion is initialized is separated from a signal output immediately after a charge (signal charge) generated and stored in each photoelectric conversion portion is transferred to the control region of the amplifying portion and a difference is taken between the two signal outputs, thereby obtaining a signal output according to only the photogenerated charge component.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 12 is a pulse timing chart for explaining the operation of the circuit diagram shown in FIG. 11;

DESCRIPTION OF THE PREFERRED EMBODIMENTS

Figure 1A:
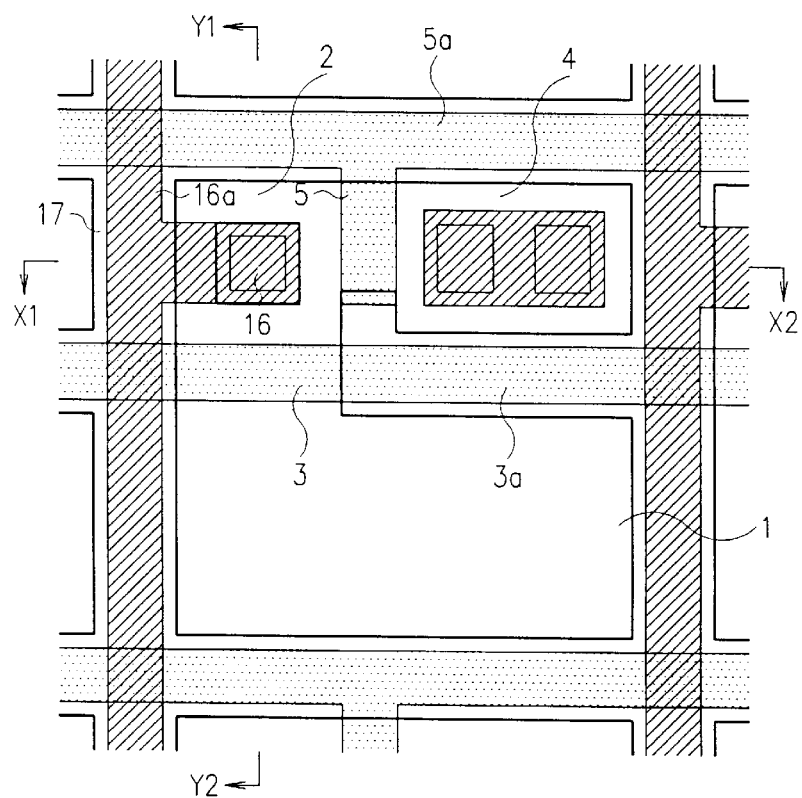
FIGS. 1A to 1C are schematic structural drawings to show the photoelectric conversion element according to Embodiment 1 of the present invention.

The embodiments of the present invention will be explained with reference to the drawings. In the drawings, same reference numerals denote same or equivalent portions, and redundant description will be omitted.

Embodiment 1

Figure 1B:
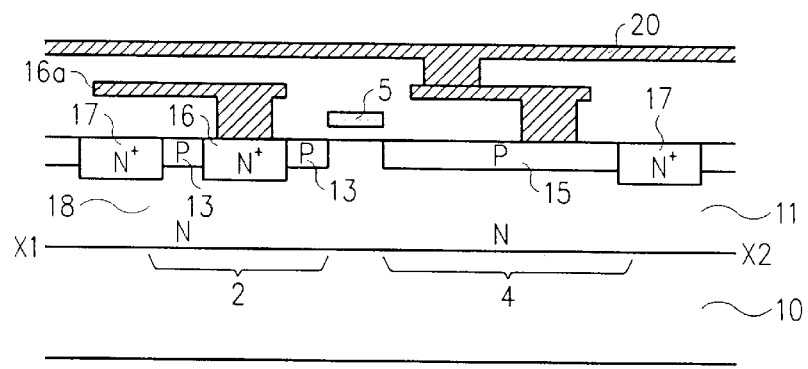
Figure 1C:
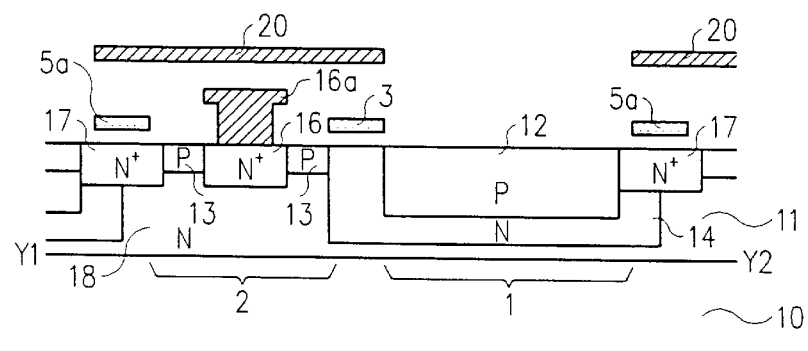

FIGS. 1A to 1C are schematic structural drawings to show the photoelectric conversion element according to Embodiment 1 of the present invention, wherein FIG. 1 is a plan view of the schematic structure to show the photoelectric conversion element, FIG. 1B a cross section along X1–X2 line in FIG. 1A, and FIG. 1C a cross section along Y1–Y2 line in FIG. 1A. In FIG. 1A and the following FIGS. 2A, 3A, 7A, 10A, 13A, 14A, depiction of an aluminum film 20 is omitted.

In these drawings, the photoelectric conversion element according to Embodiment 1 is mainly composed of a photodiode (photoelectric conversion portion, PD) 1 for generating and storing a charge according to incident light, a junction field effect transistor ((amplifying portion): hereinafter referred to as JFET) 2 for outputting a signal according to the charge received by the control region, a transfer gate (transfer-purpose control means of the transfer control portion, TG) 3 for transferring the charge generated and stored by the photodiode 1 to the control region of JFET 2, a reset drain (reset-purpose charge draining means, RD) 4 for draining the charge transferred to the control region of JFET 2, and a reset gate (reset-purpose control means, RG) 5 for controlling the reset drain 4. In addition, there are transfer gate line 3a, reset gate line 5a, and source line 16a formed as illustrated.

In more detail, an n-type silicon layer 11 to become a channel region is formed by epitaxial growth on a p-type silicon substrate 10, and, for example, boron ($B^+$) or phosphorus ($P^+$) is introduced into the n-type silicon layer 11 by an ion implantation or thermal diffusion process or the like to form a p-type photodiode region 12, a p-type gate region 13, the reset drain 4, etc. Further, the transfer gate 3 and reset gate 5 are formed through an insulating layer (not shown) by a lithography technique or the like, thus forming the photodiode 1 and JFET 2.

An n-well region 14 of the photodiode 1 is formed in order to control the overflow potential of carriers generated in the pn junction to a predetermined value.

The transfer gate 3, the p-type photodiode region 12 of photodiode 1, and the p-type gate region 13 of JFET 2 compose a p-channel MOS transistor (MOSFET; see FIGS. 1A and 1C). Further, the reset gate 5, a p-region 15 of reset drain 4 and the p-type gate region 13 of JFET 2 also compose a p-channel MOSFET (see FIGS. 1A and 1B).

The photodiode 1 includes, in order from the surface of the silicon layer to the p-type silicon substrate 10, the p-type photodiode region 12, the n-type silicon layer 11 (including the n-well region 14), and the p-type silicon substrate 10, thus forming a so-called pnp-type vertical overflow structure. This structure can suppress the phenomenon of blur such as blooming and smear due to carriers (holes in this Embodiment 1) generated accordingly.

JFET 2 is composed of an $n^+$-type source region 16, an $n^+$-type drain region 17, a p-type gate region 13, and an n-type channel region 18 (n-channel). These are arranged to form a pnp-type structure of the p-type gate region 13, the n-type channel region 18, and the p-type silicon substrate 10 in order from the surface of the silicon layer to the p-type silicon substrate 10. Consequently, the p-region (the p-type silicon substrate 10 in this Embodiment 1) below the n-type channel region 18, originally having a function of back gate, is connected to a constant power supply. The thickness (height) from the surface of the silicon layer to the surface of the p-type silicon substrate 10 is about 6 $\mu$m.

Applying a pulse voltage to the reset gate 5, the reset gate 5 and reset drain 4 initialize the control region of JFET 2 (the p-type gate region 13 in this Embodiment 1) to the potential of the reset drain 4.

Thus, JFET 2 is kept from operating (or becoming on) upon the initialization operation, in contrast to the conventional photoelectric conversion element. For example, when a photoelectric conversion apparatus is constructed by arraying a lot of these elements, the apparatus is free of occurrence of variations in outputs from the photoelectric conversion elements, which were seen in the conventional apparatus due to flow of a large current to greatly change the bias points (operating points) of transistors and thereby result in different amplification factors of JFETs 2. This results in preventing the dissipation power from becoming large and in decreasing dissipation power.

Although not shown in FIG. 1A, wiring to the reset drain 4 (metal interconnection, which is an aluminum (Al) film 20 in this Embodiment 1) also serves as a light-shielding film for shielding portions other than the photodiode 1, as seen from FIGS. 1B and 1C. This aluminum film 20 may be replaced by another metal film, which can be fabricated by depositing a metal film by the sputtering process.

Accordingly, the thickness (height) of the entire element can be kept smaller than that of an element with a further film dedicated to light shielding, which is formed on the top, the degree of integration and the aperture ratio for the photodiode 1 can be increased, and the phenomenon of blur such as blooming and smear due to obliquely incident light can be suppressed because of the structure wherein the metal wiring (aluminum film 20) is disposed in the vicinity of the photodiode 1.

Embodiment 2

Figure 2A:
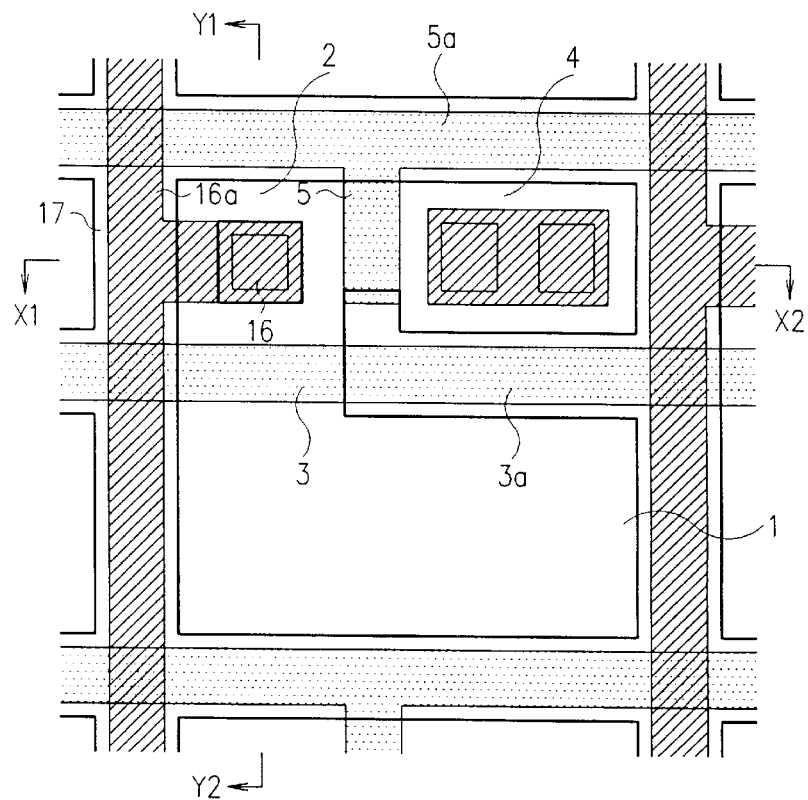
FIGS. 2A to 2C are schematic structural drawings to show the photoelectric conversion element according to Embodiment 2 of the present invention.
Figure 2B:
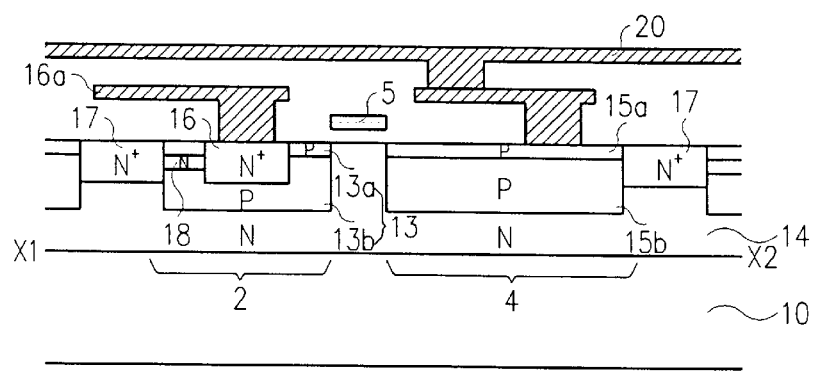
Figure 2C:
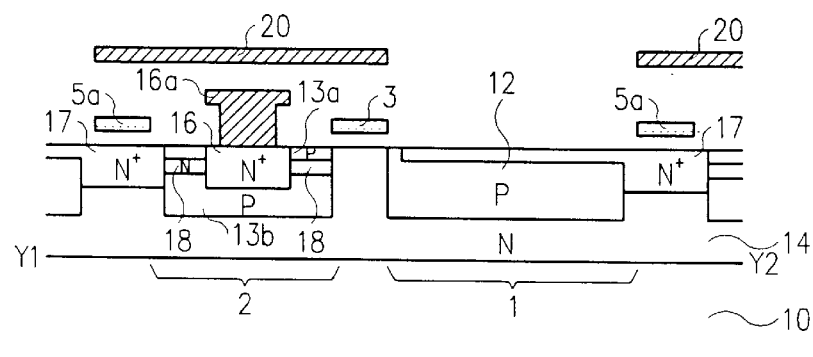

FIGS. 2A to 2C are schematic structural drawings to show the photoelectric conversion element according to Embodiment 2 of the present invention, wherein FIG. 2A is a plan view of the schematic structure to show the photoelectric conversion element, FIG. 2B a cross section along X1–X2 line in FIG. 2A, and FIG. 2C a cross section along Y1–Y2 line in FIG. 2A. This Embodiment 2 is different in the structure of the photodiode and the JFET 2 of the photoelectric conversion element from Embodiment 1.

Namely, the photodiode 1 of the photoelectric conversion element in Embodiment 2 is different from the photodiode 1 of the photoelectric conversion element in Embodiment 1 first in that a buried photodiode of an npnp type vertical overflow structure (wherein a buried photodiode is constructed by the npn structure and the overflow structure is constructed by the pnp structure) is formed from the surface of the silicon layer toward the p-type silicon substrate 10.

Accordingly, the phenomenon of blur such as blooming and smear can be suppressed by the overflow structure for absorbing overflowing carriers, while the buried photodiode prevents the depletion layer appearing in the pn junction portion from reaching the surface, thus suppressing the dark current. Since no charge remains in the photodiode (the photodiode becomes completely depleted) after transfer of charge, ideal characteristics can be achieved for suppressing the lag and reset noise.

Further, Embodiment 2 is also different from Embodiment 1 in that the n-well region 14, which was formed only around the photodiode 1 in Embodiment 1, is formed over the entire surface of the p-type silicon substrate 10. Generally, the photodiode of the vertical overflow structure is desirably constructed in such a manner that, in order to keep the quantum efficiency high, the pn junction is formed as deep as possible from the surface of the silicon layer toward the p-type silicon substrate 10.

The n-well region 14 is formed deeper toward the p-type silicon layer 10 accordingly. Since the n-well region 14 diffuses (side-diffuses) in the lateral directions (in the directions perpendicular to the direction directed toward the p-type silicon substrate 10) in this case, design taking account of this side diffusion is necessary. Embodiment 2 employs the structure in which the n-well region 14 is formed over the entire surface of the p-type silicon substrate 10 and JFET 2 is formed in this n-well region 14, thereby avoiding influence of the side diffusion of the n-well region 14 and raising the degree of integration and the aperture ratio.

The JFET 2 of the photoelectric conversion element in this Embodiment 2 is first different from the structure of JFET 2 in Embodiment 1 in that the whole (particularly, the channel portion) is shallowed (in shallow junction arrangement). Shallowing the JFET 2 for performing only the amplification operation decreases the dimensions (size) of the entire JFET 2 by that shallowing degree, which can raise the degree of integration of the entire photoelectric conversion element and the aperture ratio of the photodiode 1.

In addition, the above arrangement can enhance a characteristic as an amplifying portion, that is, transconductance (gm), and can improve a saturation characteristic (or reduce a drain voltage dependence of a saturation region). An increase of transconductance (gm) is of course important, for example when the JFET 2 is used for current amplification, and it can lower the time constant (or increase the speed) or can enhance the sensitivity in the case of source-follower operation (namely, in the case of charge amplification by capacitive load).

Second, the JFET 2 of the photoelectric conversion element in Embodiment 2 is so arranged that p-type gate regions 13 (see FIG. 2B, a first conductivity type shallow gate region 13a and a first conductivity type gate region 13b) are formed above and below the channel (n-channel) and these first conductivity type shallow gate region 13a and first conductivity type gate region 13b are electrically connected in a portion where the channel is not formed.

Further, it is different from JFET 2 in Embodiment 1 in that the p-type gate regions 13 are electrically separated from the p-type silicon substrate 10 by the n-well region 14. This can greatly reduce influence of the substrate voltage (substrate bias effect) on the characteristics of the photoelectric conversion element itself.

In addition, for example when a photoelectric conversion apparatus is composed of such photoelectric conversion elements and when JFETs 2 are in the source-follower operation, the reduction of the drain voltage dependence as discussed previously and the reduction of the substrate bias effect will present a great effect on enhancement of the sensitivity of pixels arrayed in the photoelectric conversion apparatus and on suppression of variations of sensitivity (for example, on suppression of the fixed pattern noise).

As explained above, the JFET 2 of the photoelectric conversion element according to Embodiment 2 can have an improved degree of integration and an improved aperture ratio and also have higher sensitivity than the photoelectric conversion element according to Embodiment 1, and can suppress the variations of sensitivity.

Embodiment 3

Figure 3A:
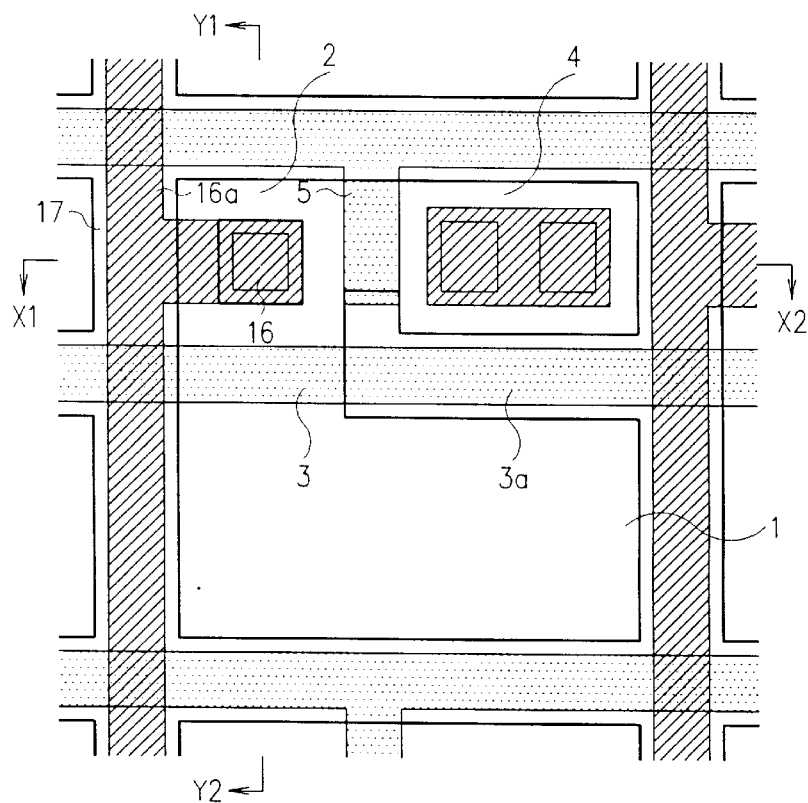
FIGS. 3A to 3C are schematic structural drawings to show the photoelectric conversion element according to Embodiment 3 of the present invention.
Figure 3B:
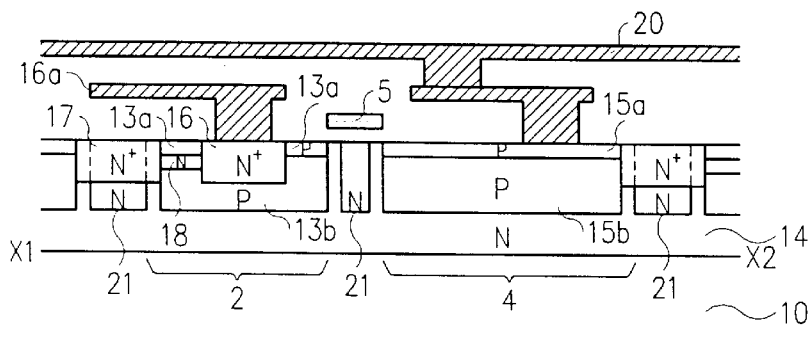
Figure 3C:
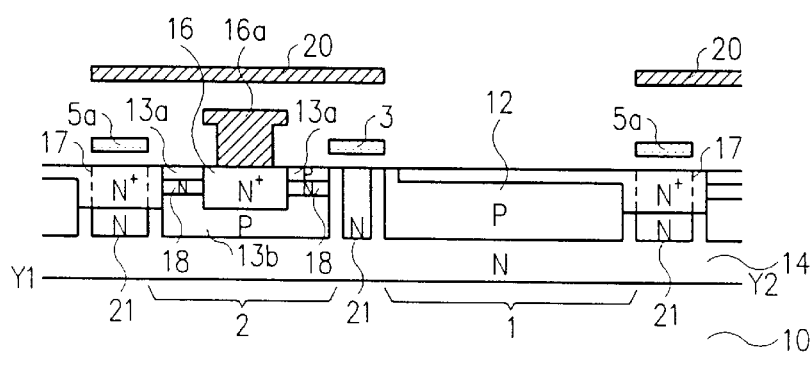

FIGS. 3A to 3C are schematic structural drawings to show the photoelectric conversion element according to Embodiment 3 of the present invention, wherein FIG. 3A is a plan view of the schematic structure to show the photoelectric conversion element, FIG. 3B a cross section along X1–X2 line in FIG. 3A, and FIG. 3C a cross section along Y1–Y2 line in FIG. 3A. The photoelectric conversion element according to Embodiment 3 is different from the above two embodiments in that an element isolation region 21 of a predetermined conductivity type (the n-type in this Embodiment 3) is formed in the peripheral regions of the photodiode 1, JFET 2, and reset drain 4 (including the regions where the transfer gate 3 and reset gate 5 are formed).

Since p-type regions of the photodiode 1, JFET 2, and reset drain 4 each are normally formed in the n-well region 14, they are electrically isolated from each other by this n-well region 14. Generally, the desired isolation of the n-well region 14 is to define the isolation width as small as possible from the viewpoint of increasing the degree of integration and the aperture ratio.

However, the p-type regions of the photodiode 1, JFET 2, and reset drain 4 cannot be formed to shallow (shallow in the direction of from the silicon surface toward the substrate) because of performance of the photoelectric conversion element. Particularly, as to the photodiode 1, it is instead desired to form it to be deep from the silicon surface toward the substrate in view of the quantum efficiency. It is thus the case that the spread (side diffusion) becomes great in the lateral directions (in the directions perpendicular to the direction directed toward the substrate) and a reduction of the isolation width cannot easily be done.

Thus, this Embodiment 3 is arranged to suppress the above side diffusion of the p-type regions by forming the n-type element isolation region 21, thereby decreasing the isolation width, increasing the degree of integration of the entire photoelectric conversion element and the aperture ratio of photodiode 1, and facilitating control of the threshold voltage of the transfer gate 3 and reset gate 5.

Embodiment 4

Figure 4:
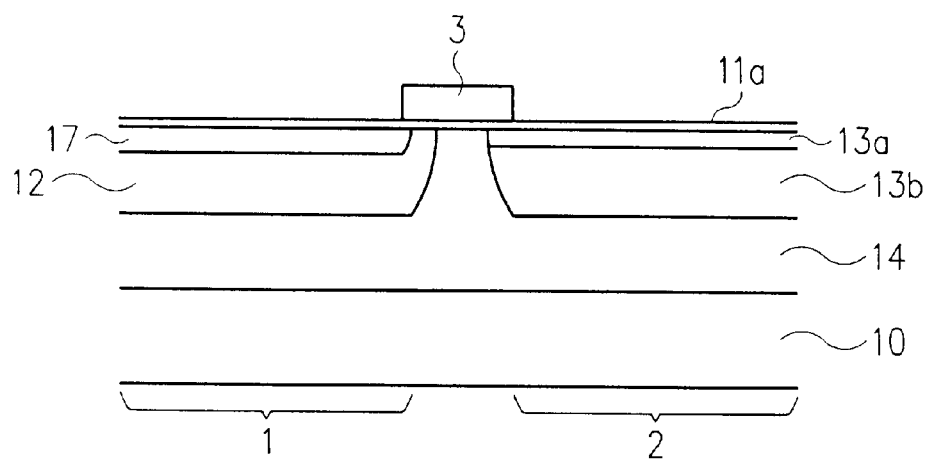
FIG. 4 is a schematic sectional view to show the essential portion of the photoelectric conversion element according to Embodiment 4 of the present invention.

FIG. 4 is a schematic sectional view to show an essential portion of the photoelectric conversion element according to Embodiment 4 of the present invention. FIG. 4 depicts a portion of FIG. 2C or 3C, therefore, the present embodiment can be explained by using the figures for embodiment of 2 or 3.

The photodiode according to this embodiment is a buried photodiode (BPD) 1 having a vertical overflow structure, as shown in FIG. 4. Thus, the p-type diffusion layer 12 used herein needs to satisfy the following conditions. An $SiO_2$ film 11a is formed on the silicon surface.

(1) An excessive photogenerated charge should overflow into the substrate.

(2) The photogenerated charge should be completely transferred to the JFET 2 upon signal reading, so that the p-type diffusion of BPD 1 may be completely depleted.

On the other hand, p-type diffusion used in JFET 2 needs to satisfy the following conditions.

(1) The charge transferred from BPD 1 should not overflow into the substrate.

(2) Punch-through should not occur between the source $n^+$-diffusion of JFET 2 and the n-well region 14.

(3) The p-type diffusion region should not be depleted under the bias conditions in operation as JFET 2.

In order to simultaneously satisfy these conditions, optimization is rather easy by setting the concentrations of the p-type diffusion regions in BPD 1 and JFET 2 separately to different values.

Thus, in the photoelectric conversion element in the present embodiment, these impurity concentrations are separately set so that the impurity concentration of the charge storing portion 12, which is the p-type diffusion region of BPD 1, may be in the range of $5 \times 10^{15}$ cm$^{-3}$ to $3 \times 10^{16}$ cm$^{-3}$ and so that the impurity concentration of the first conductivity type gate region 13b, which is the p-type diffusion region of JFET 2, may be in the range of $6 \times 10^{15}$ cm$^{-3}$ to $3 \times 10^{16}$ cm$^{-3}$. Here, these impurity concentrations can be controlled by changing the implantation conditions in boron ion implantation, for example by changing a dose.

Embodiment 5

Figure 5:
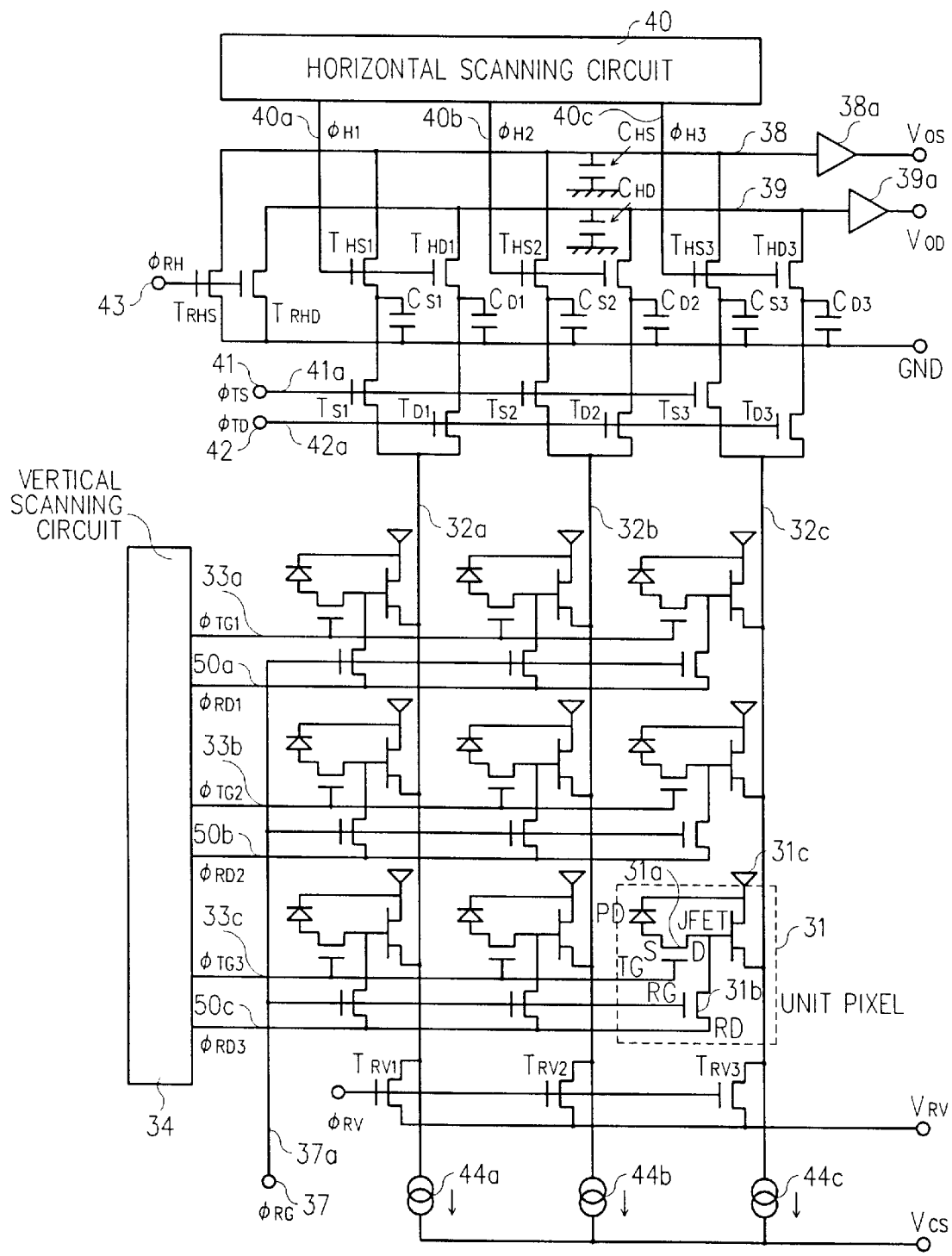
FIG. 5 is a circuit diagram to show a schematic layout of the photoelectric conversion apparatus according to Embodiment 5 of the present invention.
Figure 6:
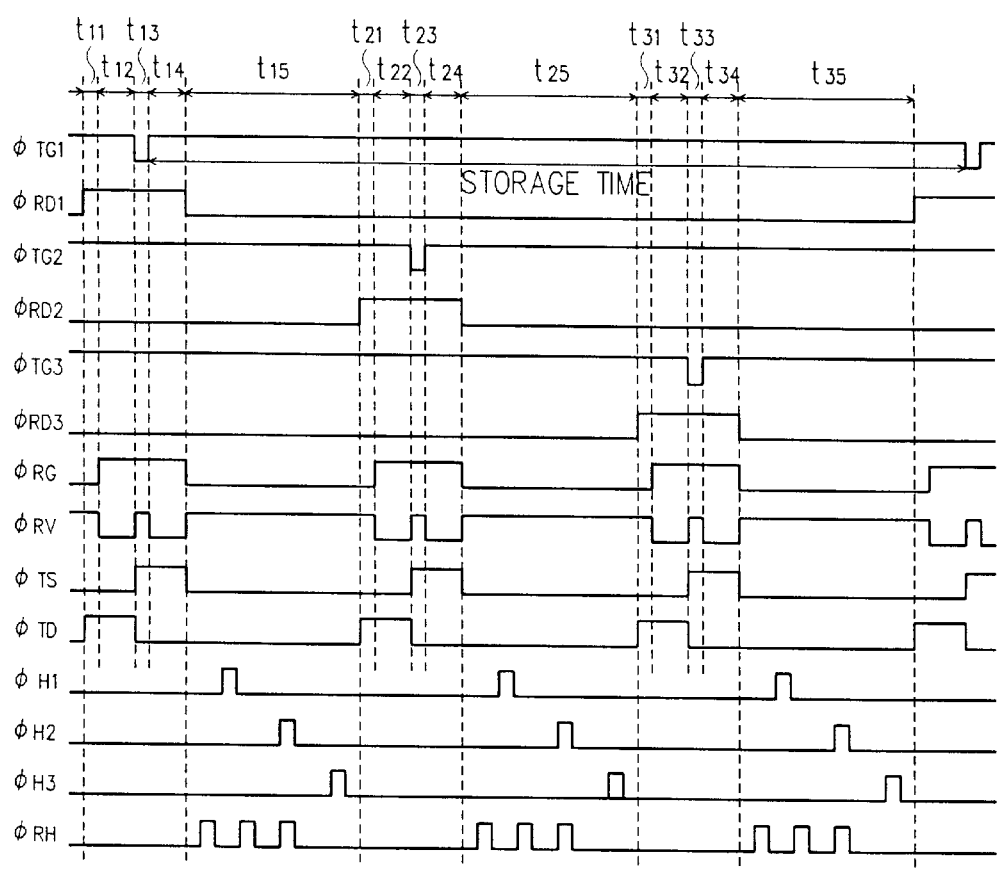
FIG. 6 is a pulse timing chart for explaining the operation of the circuit diagram shown in FIG. 5.

FIG. 5 is a circuit diagram to show the schematic structure of the photoelectric conversion apparatus according to Embodiment 5 in which photoelectric conversion elements, as described in above each Embodiment 1–4 (FIG. 1 to FIG. 4) are arranged in a two-dimensional matrix. FIG. 6 is a pulse timing chart for explaining the operation of the circuit diagram shown in FIG. 5. The photoelectric conversion apparatus in the following description will be explained as an example where the photoelectric conversion elements are those shown in FIG. 1, but the same can be applied to the cases using the photoelectric conversion elements shown in FIG. 2 to FIG. 4.

As shown in FIG. 5, each pixel 31 is composed of a photodiode PD for generating and storing a charge according to incident light, a JFET for generating a signal output according to the charge received by its control region, a transfer control element (p-channel MOSFET) 31a having a transfer gate TG for transferring the charge generated and stored in the photodiode 1 to the control region of JFET, a reset drain RD which is a reset-purpose charge draining means for draining the charge transferred to the control region of JFET, and a reset element (p-channel MOSFET) 31b having a reset gate RG, which is a reset-purpose control means for controlling the reset drain RD.

The source of each JFET is connected in common to a vertical source line 32a, 32b, 32c in each column of the matrix arrangement. All pixels 31 are connected in common to a drain power-supply 31c through a wiring (not shown) or diffusion layer formed on the drain side of each JFET and on the cathode side of the photodiode PD. Further, the anode side of each photodiode 1 and the control region of JFET 2 are connected to the source or the drain of the transfer control element 31a, respectively.

The transfer gates (transfer gate electrodes) 3 of the transfer control elements 31a in each row are connected in common to a clock line 33a, 33b, 33c to be scanned by a vertical scanning circuit 34. When a drive pulse $\Phi_{TG1}$–$\Phi_{TG3}$ sent from the vertical scanning circuit 34 is applied, the apparatus is arranged to sequentially operate the transfer control elements 31a in each row.

A reset element 31b is given for each pixel 31, and reset drains RD of the reset elements 31b are arranged in parallel in each row as being connected in common to a clock line 50a, 50b, 50c to be scanned in each row of the matrix arrangement by the vertical scanning circuit 34. The reset gates (reset gate electrodes) 5 of all the pixels are connected in common through a row line 37a to a drive pulse generating circuit 37. The source of each reset element 31b is formed in common with the drain of transfer control element 31a. When a drive pulse $\Phi_{RG}$ sent from the drive pulse generating circuit 37 is applied to the reset gate (reset gate electrode) 5, this reset element 31b is arranged to operate.

The vertical source line 32a, 32b, 32c, on one hand, is connected in each column through a MOS transistor for transferring a light signal output $T_{S1}$, $T_{S2}$, $T_{S3}$ and through a MOS transistor for transferring a dark output $T_{D1}$, $T_{D2}$, $T_{D3}$ to one electrode of a capacitor for storing the light signal output (second memory element) $C_{S1}$, $C_{S2}$, $C_{S3}$ and to one electrode of a capacitor for storing the dark output (first memory element) $C_{D1}$, $C_{D2}$, $C_{D3}$ and then is connected through MOS transistors for selection of horizontal reading $T_{HS1}$, $T_{HS2}$, $T_{HS3}$, $T_{HD1}$, $T_{HD2}$, $T_{HD3}$ to a signal output line 38 and a dark output line 39. Generally, parasitic capacitances $C_{HS}$, $C_{HD}$ exist in the signal output line 38 and dark output line 39. A buffer amplifier 38a, 39a is connected to one end of each of the signal output line 38 and dark output line 39.

The signal output line 38 and dark output line 39, on the other hand, are connected to the drains of MOS transistors for resetting the signal output lines $T_{RHS}$, $T_{RHD}$, respectively, and the sources of MOS transistors $T_{RHS}$, $T_{RHD}$ are grounded (GND) as being connected to the other electrodes of the above capacitors for storing the light signal output $C_{S1}$, $C_{S2}$, $C_{S3}$ and capacitors for storing the dark output $C_{D1}$, $C_{D2}$, $C_{D3}$. When a drive pulse $\Phi_{RH}$ sent from the drive pulse generating circuit 43 is applied to the gate electrodes of the MOS transistors for resetting the signal output lines $T_{RHS}$, $T_{RHD}$, the MOS transistors $T_{RHS}$, $T_{RHD}$ are arranged to start operating.

A horizontal selection line 40a, 40b, 40c connected to a horizontal scanning circuit 40 in each column is connected in common to the gate electrodes of the MOS transistors for selection of horizontal reading $T_{HS1}$, $T_{HS2}$, $T_{HS3}$ and $T_{HD1}$, $T_{HD2}$, $T_{HD3}$, so that horizontal reading may be controlled by a drive pulse $\Phi_{H1}$ to $\Phi_{H3}$ sent from the horizontal scanning circuit 40.

The gate electrodes of the above MOS transistors for transferring the light signal outputs $T_{S1}$, $T_{S2}$, $T_{S3}$ are connected through a clock line for light signal 41a and the gate electrodes of the above MOS transistors for transferring the dark outputs $T_{D1}$, $T_{D2}$, $T_{D3}$ are connected through a clock line for dark output 42a, each to a drive pulse generating circuit 41 or 42. When a drive pulse $\Phi_{TS}$ or $\Phi_{TD}$ sent from the drive pulse generating circuit 41 or 42 is applied to the gate electrodes through either line, these MOS transistors for transmission of light signal output $T_{S1}$, $T_{S2}$, $T_{S3}$ and MOS transistors for transmission of dark output $T_{D1}$, $T_{D2}$, $T_{D3}$ are arranged alternately to operate in a predetermined order.

The above vertical source line 32a, 32b, 32c in each column, on the other hand, is connected to the drain of a transistor for reset $T_{RV1}$, $T_{RV2}$, $T_{RV3}$ and to a constant current source for source-follower reading 44a, 44b, 44c. A power-supply voltage $V_{RV}$ is supplied to the source of each reset transistor $T_{RV1}$, $T_{RV2}$, $T_{RV3}$, and a power-supply voltage $V_{CS}$ is supplied to the constant current sources for source-follower reading 44a, 44b, 44c.

A reset pulse $\Phi_{RV}$ is supplied to the gate electrodes of the reset transistors $T_{RV1}$, $T_{RV2}$, $T_{RV3}$, and with a change of this reset pulse $\Phi_{RV}$ to high level the reset transistors $T_{RV1}$, $T_{RV2}$, $T_{RV3}$ become on so as to ground the vertical source lines 32a, 32b, 32c (when $V_{RV}$=GND).

The constant current sources for source-follower reading 44a, 44b, 44c control the time constant of source-follower operation, and also suppress variations of the time constant due to fluctuations of the bias point for every pixel 31 to equalize the gains, thus suppressing the fixed pattern noise (hereinafter referred to as FPN).

The operation of the photoelectric conversion apparatus according to Embodiment 5 of the present invention is next explained referring to the pulse timing chart shown in FIG. 6. In FIG. 6, the period between $t_{11}$ and $t_{15}$ represents the reading operation of pixels 31 in the first row, and thereafter the periods between $t_{21}$ and $t_{25}$ and between $t_{31}$ and $t_{35}$ correspond to the second row and the third row, respectively. Further, $t_{11}$ to $t_{14}$ each are so defined that $t_{11}$ is the period for the initialization operation of JFETs 2, $t_{12}$ the period for the source-follower operation of JFETs 2 in the first row after initialization, $t_{13}$ the period for the transfer operation of signal charges from the photodiodes 1 to the JFETs 2 in the first row, and $t_{14}$ the period for the source-follower operation of JFETs 2 after transfer, and these four operations are carried out in the horizontal blanking period. Further, $t_{15}$ is the image signal output period.

First, as shown in FIG. 6, the drive pulse $\Phi_{RD1}$ is set to the high level while keeping the drive pulses $\Phi_{RD2}$ and $\Phi_{RD3}$ at the low level) at the start of period $t_{11}$ whereby the voltage drive pulse is applied to the reset drains 4 of pixels 31 in the first row. Then the high level voltage is applied to the control regions of JFETs 2 of the pixels 31 in the first row and the low level voltage is applied to the control regions of JFETs 2 of the pixels 31 in the other rows through the reset gates 5 of all the pixels 31 already set in a conductive (on) state at the low level. By this operation, the control regions of these JFETs 2 are initialized (the charges therein are drained) and the JFETs 2 in the first row are selected (on) while the JFETs 2 in the other rows are not selected (off).

Namely, selection (on) or non-selection (off) of JFETs 2 is effected depending upon whether the voltage drive pulse ($\Phi_{RD1}$, $\Phi_{RD2}$, $\Phi_{RD3}$) is sent to a row of the reset drains 4 or not. Then, the control regions of JFETs 2 in the selected row are initialized to the high level voltage and the control regions of JFETs 2 in the non-selected row are initialized to the low level voltage.

At the end of period $t_{11}$ (or at the start of period $t_{12}$) the drive pulse $\Phi_{RG}$ is changed to the high level so as to change the reset gates 5 into a non-conductive (off) state whereby the control regions of the respective JFETs 2 are kept in a floating state as maintaining the selected (on) or the non-selected (off) state.

At the same time (at the start of period $t_{12}$), the drive pulse $\Phi_{RV}$ is changed to the low level to bring the reset transistors $T_{RV1}$ to $T_{RV3}$ into an interrupted (off) state, and the JFETs 2 in the first row perform the source-follower operation in this period $t_{12}$. During this period $t_{12}$ the drive pulse $\Phi_{TD}$ is at the high level to keep the MOS transistors for transfer of dark output $T_{D1}$, $T_{D2}$, $T_{D3}$ in a conductive state (on) and output (output at dark) voltages corresponding to the potentials immediately after the initialization of the control regions of the JFETs 2 are stored in the capacitors for storage of dark output $C_{D1}$, $C_{D2}$, $C_{D3}$.

In the period $t_{13}$, the drive pulse $\Phi_{TG1}$ is turned to the low level to bring the transfer gates 3 from the non-conductive (off) state to the conductive (on) state, and the drive pulse $\Phi_{TS}$ is changed to the high level and the drive pulse $\Phi_{TD}$ to the low level, thereby changing the MOS transistors for transfer of light signal output $T_{S1}$, $T_{S2}$, $T_{S3}$ into the conductive (on) state and the MOS transistors for transfer of dark output $T_{D1}$, $T_{D2}$, $T_{D3}$ into the non-conductive (off) state.

As a result, charges generated and stored in the photodiodes 1 in the first row are transferred to the control regions of JFETs 2. After transfer of charge the potential of each control region of JFET 2 changes (increases in this case) by a degree of charge amount/gate capacitance. The reason why the transfer gates 3 change into the conductive (on) state when the drive pulse $\Phi_{TG1}$ is kept at the low level in FIG. 6 is that the transfer control elements 31a are of the p-channel type and thus the polarity of the drive pulse $\Phi_{TG1}$ is opposite to that of the other drive pulses.

In the period $t_{14}$, similarly as in the period $t_{12}$, the drive pulse $\Phi_{TG1}$ is changed to the high level to bring the transfer gates 3 in the first row into the non-conductive (off) state whereby the charges photoelectrically converted in the photodiodes 1 are stored, and the drive pulse $\Phi_{RV}$ is changed to the low level to bring the reset transistors $T_{RV1}$ to $T_{RV3}$ into the interrupted (off) state whereby the JFETs 2 in the first row perform the source-follower operation.

Since during this period $t_{14}$ the drive pulse $\Phi_{TS}$ is at the high level, the MOS transistors for transfer of light signal output $T_{S1}$, $T_{S2}$, $T_{S3}$ are kept in the conductive state (on), and output (signal output) voltages corresponding to potentials after the charges are transferred to the control regions of the respective JFETs 2 are stored in the capacitors for storage of light signal output $C_{S1}$, $C_{S2}$, $C_{S3}$. In the period $t_{15}$, the drive pulses $\Phi_{RD1}$, $\Phi_{RG}$, $\Phi_{TS}$ are each changed to the low level and the drive pulse $\Phi_{RV}$ to the high level, so that the output voltages (image signals) stored in the capacitors for storage of light signal output $C_{S1}$ to $C_{S3}$ and capacitors for storage of dark output $C_{D1}$ to $C_{D3}$ are ready to be output to the output terminals $V_{OS}$, $V_{OD}$.

Then sequentially outputting the drive pulses $\Phi_{H1}$ to $\Phi_{H3}$ from the horizontal scanning circuit 40 and the drive pulse $\Phi_{RH}$ from the drive pulse generating circuit 43, the image signals stored in the capacitors for storage of light signal output $C_{S1}$ to $C_{S3}$ and the capacitors for storage of dark output $C_{D1}$ to $C_{D3}$ are read out into the horizontal reading lines of signal output line 38 and dark output line 39, respectively, then, the image signals are output from the terminals $V_{OS}$, $V_{OD}$, while horizontal reading lines of signal output line 38 and dark output line 39 are reset.

The image signals obtained from the output terminals $V_{OS}$, $V_{OD}$ are subjected to arithmetic processing by an external arithmetic circuit not shown. This is effected as follows. Since an image signal obtained from the output terminal $V_{OS}$ contains a charge component (S) and a dark component (D) and an image signal obtained from the output terminal $V_{OD}$ contains only the dark component (D), only the image signal according to the charge component (S) is extracted by the arithmetic processing of the image signals obtained from the output terminals $V_{OS}$, $V_{OD}$ (by subtraction processing ($V_{OS}$–$V_{OD}$)).

The above reading operation for the first row in the periods $t_{11}$ to $t_{15}$ is repeated similarly for the second row and the third row in the periods $t_{21}$ to $t_{25}$ and in the periods $t_{31}$ to $t_{35}$, respectively. Since the photoelectric conversion apparatus in the first embodiment is arranged in such a manner that the reset element 31b is provided for each pixel 31 and the reset drains 4 are arranged in parallel with each other in each row, the reset operation becomes very fast and the total time of the periods $t_{11}$ to $t_{15}$, $t_{21}$ to $t_{25}$, $t_{31}$ to $t_{35}$ becomes shorter than those of the conventional photoelectric conversion apparatus.

Embodiment 6

Figure 7A:
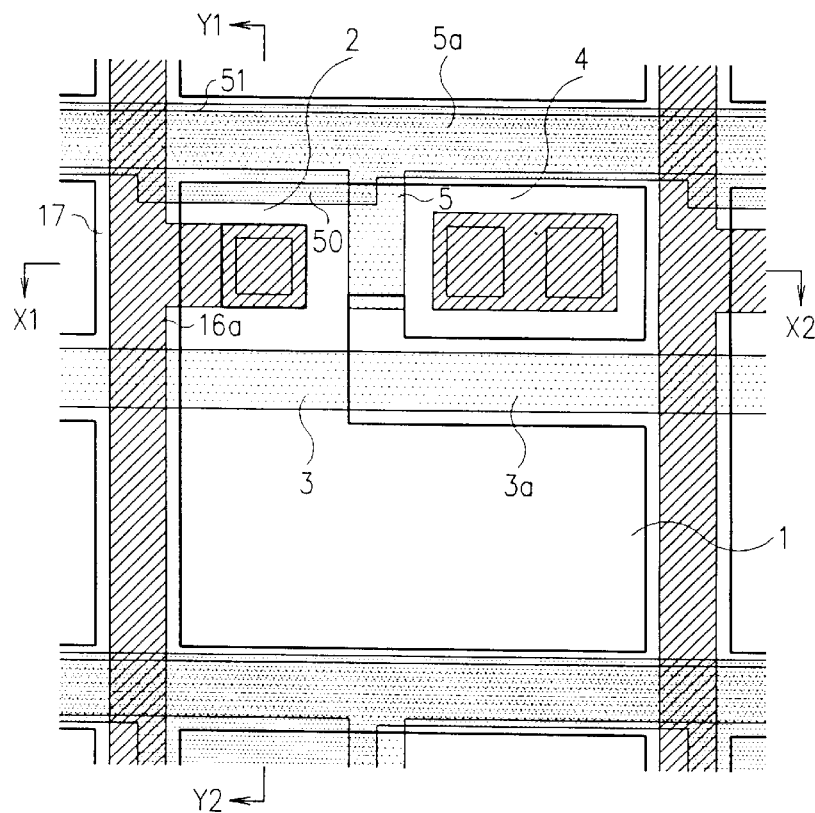
FIGS. 7A to 7C are schematic structural drawings to show the photoelectric conversion element according to Embodiment 6 of the present invention.
Figure 7B:
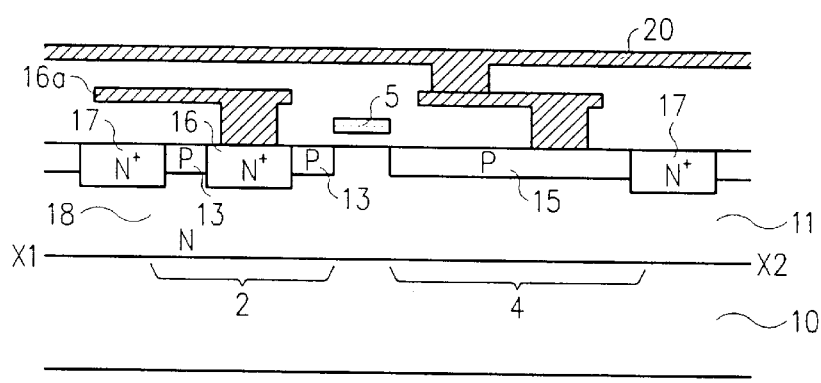
Figure 7C:
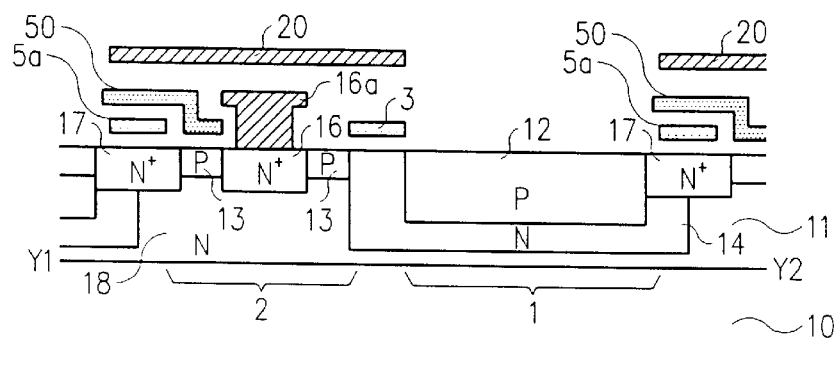

FIGS. 7A to 7C are schematic structural drawings to show the photoelectric conversion element according to Embodiment 6 of the present invention, wherein FIG. 7A is a plan view of the schematic structure to show the photoelectric conversion element, FIG. 7B a cross section along X1–X2 line in FIG. 7A, and FIG. 7C a cross section along Y1–Y2 line in FIG. 7A. The photoelectric conversion element shown in FIGS. 7A to 7C is most different from the photoelectric conversion elements shown in FIG. 1 to FIG. 4 in that a gate electrode 50 is formed for controlling the control region of JFET 2 by capacitive coupling in JFET 2 (the amplifying portion). The other structure of this photoelectric conversion element is the same as the photoelectric conversion element shown in FIG. 1. A gate line 51 is formed as shown in FIG. 7A.

In ordinary JFET 2, the gate electrode 50 for controlling the control region by capacitive coupling is formed. However, the photoelectric conversion elements shown in FIG. 1 to FIG. 4 exclude the gate electrode 50. The differences due to the formation of gate electrode 50 will be explained in the next description of a photoelectric conversion apparatus having photoelectric conversion elements (FIGS. 7A to 7C) arranged in a two-dimensional matrix where the gate electrode 50 is formed.

The photoelectric conversion element shown in FIGS. 7A to 7C is the same as the photoelectric conversion element shown in FIGS. 1A to 1C except that the gate electrode 50 is formed. If the structures of photodiode 1 and JFET 2 of the photoelectric conversion element shown in FIGS. 7A to 7C are replaced by the structures of photodiode 1 and JFET 2 of the photoelectric conversion element shown in FIGS. 2A to 2C, the photoelectric conversion element thus obtained becomes the same as the photoelectric conversion element shown in FIGS. 2A to 2C except that the gate electrode 50 is formed. Further, if the element isolation region 21 of the predetermined conductivity type is formed between the mutual regions of the photodiode 1, JFET 2, and reset drain 4 of the photoelectric conversion element shown in FIGS. 7A to 7C, it becomes the same as the photoelectric conversion element shown in FIGS. 3A to 3C except that the gate electrode 50 is formed. The description of the same portions is thus omitted herein.

Embodiment 7

Figure 8:
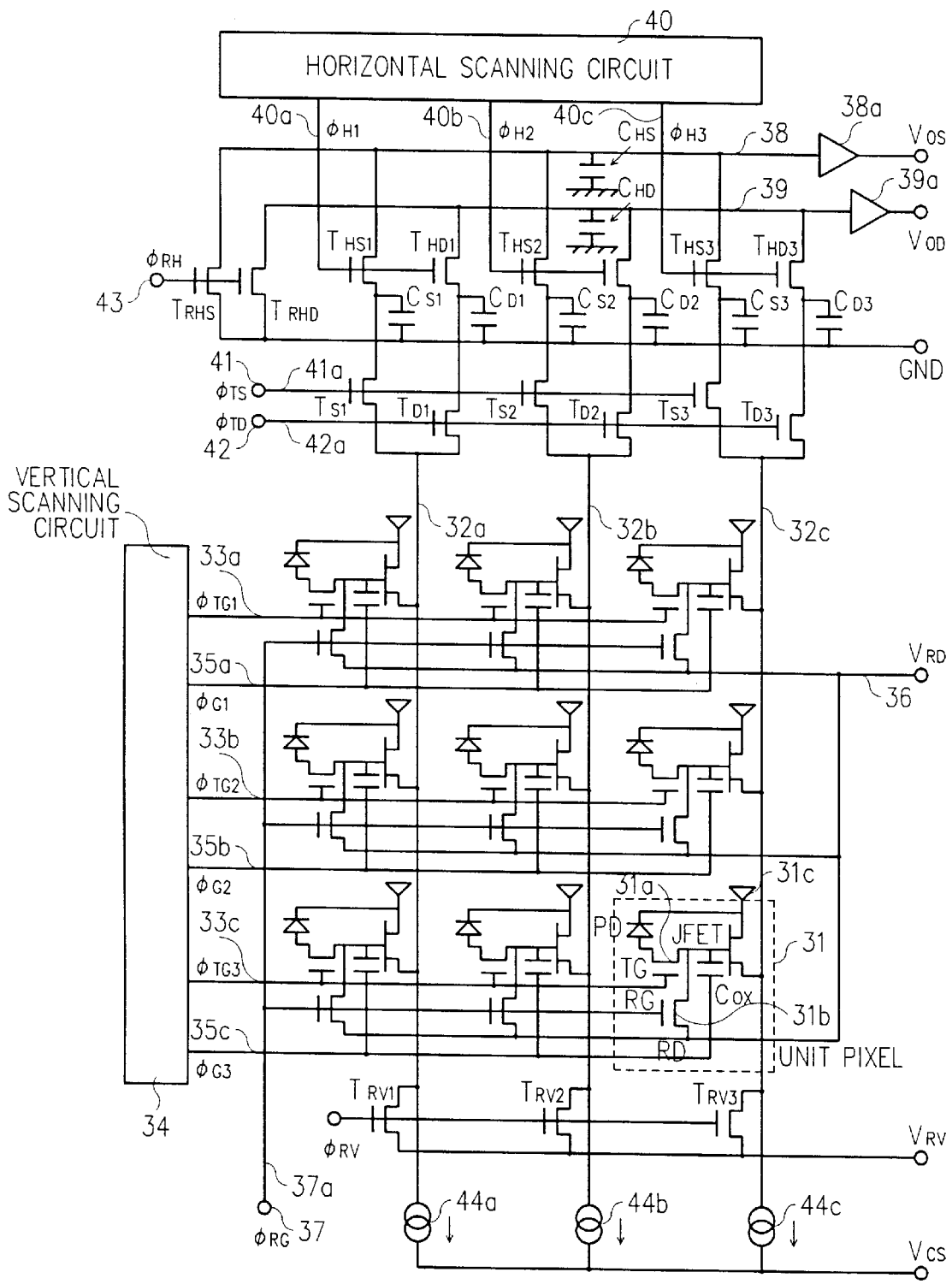
FIG. 8 is a circuit diagram to show a schematic layout of the photoelectric conversion apparatus according to Embodiment 7 of the present invention.

FIG. 8 is a circuit diagram to show the schematic structure of the photoelectric conversion apparatus according to Embodiment 7 of the present invention, in which the photoelectric conversion elements shown in FIGS. 7A to 7C are arranged in a two-dimensional matrix. Comparing FIG. 8 with FIG. 5 (Embodiment 5), the photoelectric conversion apparatus shown in FIG. 8 is arranged in such a manner that the gate electrodes 50 of JFETs 2 forming the respective pixels (photoelectric conversion elements) 31 in each row are connected in common to the vertical scanning circuit 34. The gate electrodes 50 are pulse-driven.

In the photoelectric conversion apparatus as explained in FIG. 5 the reset drains 4 were pulse-driven instead of the above gate electrodes 50, because no gate electrodes 50 were formed in the JFETs 2. It is, however, noted that the photoelectric conversion apparatus explained in FIG. 5 can obviate a need to form wiring to the gate electrodes 50 because no gate electrodes 50 are formed in the JFETs 2. Accordingly, the capacitance of each control region of JFET 2 can be decreased because of the absence of the gate electrode 50, thus presenting an advantage that the sensitivity can be enhanced.

In contrast, the photoelectric conversion apparatus shown in FIG. 8 has an advantage that the reset drains 4 do not have to be pulse-driven because the gate electrodes 50 are formed in the JFETs 2.

In the photoelectric conversion apparatus shown in FIG. 8, each pixel 31 is composed of a photodiode 1 for generating and storing a charge according to incident light, a gate electrode 50 for controlling the control region by capacitive coupling, a JFET 2 for producing a signal output according to the charge received by the control region, a transfer control element (p-channel MOSFET) 31a having a transfer gate 3 for transferring the charge generated and stored in the photodiode 1 to the control region of JFET 2, a reset drain 4 for draining the charge transferred to the control region of JFET 2, and a reset element (p-channel MOSFET) 31b having a reset gate 5 for controlling the reset drain 4.

The sources of JFETs 2 in each column of the matrix arrangement are connected in common to the vertical source line 32a, 32b, 32c. All the pixels are connected in common to the drain power-supply 31c through a wiring (not shown) or diffusion layer on the drain side of each JFET 2 and on the cathode side of photodiode 1. Further, the anode side of each photodiode 1 and the control region of JFET 2 each are connected to the source or the drain of the transfer control element 31a.

The transfer gates (transfer gate electrodes) 3 of the transfer control elements 31a are connected in common in each row of the matrix arrangement to the clock line 33a, 33b, 33c to be scanned by the vertical scanning circuit 34, and with application of the drive pulse $\Phi_{TG1}$ to $\Phi_{TG3}$ sent from the above vertical scanning circuit 34 the transfer control elements 31a are sequentially operated in each row.

The gate electrodes 50 in JFETs 2 are connected in common in each row of the matrix arrangement to the clock line 35a, 35b, 35c to be scanned by the vertical scanning circuit 34, and the JFETs 2 are sequentially operated in each row when the drive pulse $\Phi_{G1}$–$\Phi_{G3}$ sent from the above vertical scanning circuit 34 is applied thereto.

A reset element 31b is given for each pixel 31, and reset drains 4 of all the pixels are connected in common to the power-supply voltage $V_{RD}$ through a row line 36. The reset gates (reset gate electrodes) 5 of the all pixels are also connected in common through the row line 37a to the drive pulse generating circuit 37. The source of each reset element 31b is formed in common with the drain of transfer control element 31a. When a drive pulse $\Phi_{RG}$ sent from the drive pulse generating circuit 37 is applied to the reset gate 5, this reset element 31b is arranged to operate, thus initializing the control region of JFET 2.

The above vertical source line 32a, 32b, 32c, on one hand, is connected in each column through a MOS transistor for transferring the light signal output $T_{S1}$, $T_{S2}$, $T_{S3}$ and through MOS transistor for transferring a dark output $T_{D1}$, $T_{D2}$, $T_{D3}$ to one electrode of the capacitor for storing the light signal output (second memory element) $C_{S1}$, $C_{S2}$, $C_{S3}$ and to one electrode of the capacitor for storing the dark output (first memory element) $C_{D1}$, $C_{D2}$, $C_{D3}$ and then is connected through the MOS transistors for selection of horizontal reading $T_{HS1}$, $T_{HS2}$, $T_{HS3}$, $T_{HD1}$, $T_{HD2}$, $T_{HD3}$ to the signal output line 38 and the dark output line 39. Generally, parasitic capacitances $C_{HS}$, $C_{HD}$ exist in the signal output line 38 and dark output line 39. A buffer amplifier 38a, 39a is connected to one end of each of the signal output line 38 and dark output line 39.

The above signal output line 38 and dark output line 39 are connected to the drains of MOS transistors for resetting the signal output lines $T_{RHS}$, $T_{RHD}$, respectively, and the sources of MOS transistors $T_{RHS}$, $T_{RHD}$ are grounded (GND) as being connected to the other electrodes of the above capacitors for storing the light signal output $C_{S1}$, $C_{S2}$, $C_{S3}$ and capacitors for storing the dark output $C_{D1}$, $C_{D2}$, $C_{D3}$. When a drive pulse $\Phi_{RH}$ sent from the drive pulse generating circuit 43 is applied to the gate electrodes of the MOS transistors for resetting the signal output lines $T_{RHS}$, $T_{RHD}$, the MOS transistors $T_{RHS}$, $T_{RHD}$ are arranged to start operating.

A horizontal selection line 40a, 40b, 40c connected to a horizontal scanning circuit 40 in each column is connected in common to the gate electrodes of the MOS transistors for selection of horizontal reading $T_{HS1}$, $T_{HS2}$, $T_{HS3}$ and $T_{HD1}$, $T_{HD2}$, $T_{HD3}$, so that horizontal reading may be controlled by a drive pulse $\Phi_{H1}$ to $\Phi_{H3}$ sent from the horizontal scanning circuit 40.

The gate electrodes of the above MOS transistors for transferring the light signal outputs $T_{S1}$, $T_{S2}$, $T_{S3}$ are connected through a clock line for light signal 41a and the gate electrodes of the above MOS transistors for transferring the dark outputs $T_{D1}$, $T_{D2}$, $T_{D3}$ are connected through a clock line for dark output 42a, each to a drive pulse generating circuit 41 or 42. When a drive pulse $\Phi_{TS}$ or $\Phi_{TD}$ sent from the drive pulse generating circuit 41 or 42 is applied to the gate electrodes through either line, these MOS transistors for transmission of light signal output $T_{S1}$, $T_{S2}$, $T_{S3}$ and MOS transistors for transmission of dark output $T_{D1}$, $T_{D2}$, $T_{D3}$ are arranged alternately to operate in a predetermined order.

The above vertical source line 32a, 32b, 32c in each column, on the other hand, is connected to the drain of a transistor for reset $T_{RV1}$, $T_{RV2}$, $T_{RV3}$ and to a constant current source for source-follower reading 44a, 44b, 44c. A power-supply voltage $V_{RV}$ is supplied to the source of each reset transistor $T_{RV1}$, $T_{RV2}$, $T_{RV3}$, and a power-supply voltage $V_{CS}$ is supplied to the constant current sources for source-follower reading 44a, 44b, 44c.

A reset pulse $\Phi_{RV}$ is supplied to the gate electrodes of the reset transistors $T_{RV1}$, $T_{RV2}$, $T_{RV3}$, and with a change of this reset pulse $\Phi_{RV}$ to the high level the reset transistors $T_{RV1}$, $T_{RV2}$, $T_{RV3}$ become on so as to ground the vertical source lines 32a, 32b, 32c (when $V_{RV}$=GND).

The constant current sources for source-follower reading 44a, 44b, 44c control the time constant of source-follower operation, and also suppress variations of the time constant due to fluctuations of bias point for every pixel 31 to equalize the gains, thus suppressing FPN.

Figure 9:
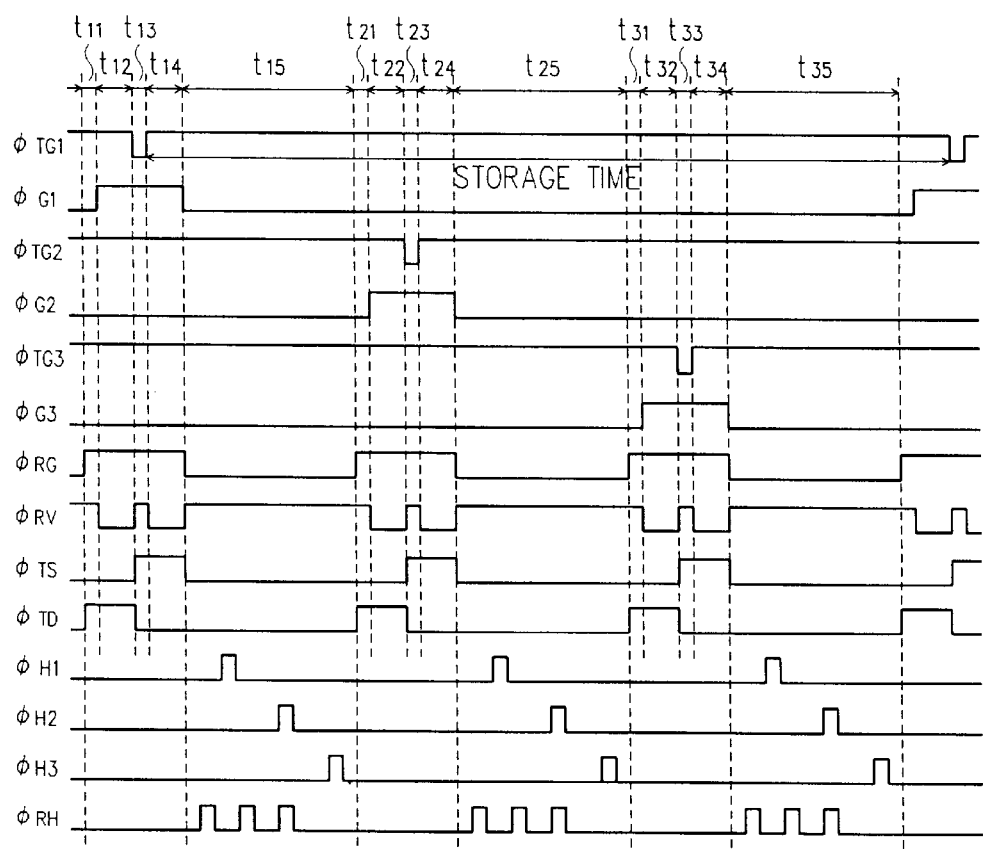
FIG. 9 is a pulse timing chart for explaining the operation of the circuit diagram shown in FIG. 8.

The operation of the photoelectric conversion apparatus according to Embodiment 7 of the present invention shown in FIG. 8 is next explained referring to the pulse timing chart shown in FIG. 9. In FIG. 9, the period between $t_{11}$ and $t_{15}$ represents the reading operation of pixels 31 in the first row, and thereafter the periods between $t_{21}$ and $t_{25}$ and between $t_{31}$ and $t_{35}$ correspond to the second row and the third row, respectively. Further, $t_{11}$ to $t_{14}$ each are so defined that $t_{11}$ is the period for the initialization operation of JFET 2, $t_{12}$ the period for the source-follower operation of JFET 2 in the first row after initialization, $t_{13}$ the period for the transfer operation of signal charge from the photodiode 1 to the JFET 2 in the first row, and $t_{14}$ the period for the source-follower operation of JFET 2 after transfer, and these four operations are carried out in the horizontal blanking period. Further, $t_{15}$ is the image signal output period.

First, as shown in FIG. 9, in the period $t_{11}$ the drive pulses $\Phi_{RG}$ and $\Phi_{TD}$ are changed to the high level whereby the reset gates 5 of the respective pixels 31 are changed from the conductive (on) state into the non-conductive (off) state and the MOS transistors for transfer of dark output $T_{D1}$, $T_{D2}$, $T_{D3}$ are changed into the conductive (on) state.

As a result, the control regions of all JFETs 2 come to have the potential of the power-supply voltage $V_{RD}$ connected through the reset drains 4 and the row line 36 so as to be initialized (the charges are drained), thus turning to a floating state. The reason why the drive pulse $\Phi_{RG}$ to the reset gates 5 is at the high level to keep the reset gates 5 in the non-conductive state (off) is that the polarity is opposite to that of the other drive pulses because the reset elements 31b are of the p-channel type.

Next at the start of the period $t_{12}$, the drive pulse $\Phi_{G1}$ is changed to the high level to raise the potential of the gate electrodes of JFETs 2 in the first row, whereby the JFETs 2 in the first row are selected (on) and the JFETs in the second and the other rows are not selected (off). Namely, when the reset gates 5 are in the non-conductive state (off), selection (on) or non-selection (off) of JFETs 2 is effected depending upon whether the drive pulse ($\Phi_{G1}$, $\Phi_{G2}$, $\Phi_{G3}$) is sent to a row of the gate electrodes of JFETs or not.

At the same time (at the start of period $t_{12}$), the drive pulse $\Phi_{RV}$ is changed to the low level to bring the reset transistors $T_{RV1}$ to $T_{RV3}$ into an interrupted (off) state, and the JFETs 2 in the first row perform the source-follower operation in this period $t_{12}$. During this period $t_{12}$ the drive pulse $\Phi_{TD}$ is at the high level to keep the MOS transistors for transfer of dark output $T_{D1}$, $T_{D2}$, $T_{D3}$ in a conductive state (on) and output (output at dark) voltages corresponding to the potentials immediately after the initialization of the control regions of the JFETs 2 are stored in the capacitors for storage of dark output $C_{D1}$, $C_{D2}$, $C_{D3}$.

In the period $t_{13}$, the drive pulse $\Phi_{TG1}$ is turned to the low level to bring the transfer gates 3 from the non-conductive (off) state into the conductive (on) state, and the drive pulse $\Phi_{TS}$ is changed to the high level and the drive pulse $\Phi_{TD}$ to the low level, thereby changing the MOS transistors for transfer of light signal output $T_{S1}$, $T_{S2}$, $T_{S3}$ into the conductive (on) state and the MOS transistors for transfer of dark output $T_{D1}$, $T_{D2}$, $T_{D3}$ into the non-conductive (off) state.

As a result, charges generated and stored in the photodiodes 1 in the first row are transferred to the control regions of JFETs 2. After transfer of charge the potential of each control region of JFET 2 changes (increases in this case) by a degree of charge amount/gate capacitance. The reason why the transfer gates 3 are in the conductive state (on) when the drive pulse $\Phi_{TG1}$ is kept at the low level in FIG. 9 is that the transfer control elements 31a are of the p-channel type and thus the polarity is opposite to that of the other drive pulses.

In the period $t_{14}$, similarly as in the period $t_{12}$, the drive pulse $\Phi_{TG1}$ is changed to the high level to bring the transfer gates 3 in the first row into the non-conductive (off) state whereby the charges photoelectrically converted in the photodiodes 1 are kept as stored, and the drive pulse $\Phi_{RV}$ is changed to the low level to bring the reset transistors $T_{RV1}$ to $T_{RV3}$ to the interrupted (off) state whereby the JFETs 2 in the first row perform the source-follower operation.

Since during this period $t_{14}$ the drive pulse $\Phi_{TS}$ is at the high level, the MOS transistors for transfer of light signal output $T_{S1}$, $T_{S2}$, $T_{S3}$ are kept in the conductive state (on), and output (signal output) voltages corresponding to potentials after the charges are transferred to the control regions of the respective JFETs 2 are stored in the capacitors for storage of light signal output $C_{S1}$, $C_{S2}$, $C_{S3}$.

In the period $t_{15}$, the drive pulses $\Phi_{RD1}$, $\Phi_{RG}$, $\Phi_{TS}$ are each changed to the low level and the drive pulse $\Phi_{RV}$ to the high level, so that the output voltages (image signals) stored in the capacitors for storage of light signal output $C_{S1}$ to $C_{S3}$ and capacitors for storage of dark output $C_{D1}$ to $C_{D3}$ are ready to be output to the output terminals $V_{OS}$, $V_{OD}$.

Then sequentially outputting the drive pulses $\Phi_{H1}$ to $\Phi_{H3}$ from the horizontal scanning circuit 40 and the drive pulse $\Phi_{RH}$ from the drive pulse generating circuit 43, the image signals stored in the capacitors for storage of light signal output $C_{S1}$ to $C_{S3}$ and the capacitors for storage of dark output $C_{D1}$ to $C_{D3}$ are read out into the horizontal reading lines of signal output line 38 and dark output line 39, respectively, then, the image signals are output from the terminals $V_{OS}$, $V_{OD}$, while horizontal reading lines of signal output line 38 and dark output line 39 are reset.

The image signals obtained from the output terminals $V_{OS}$, $V_{OD}$ are subjected to arithmetic processing by an external arithmetic circuit not shown. This is effected as follows. Since an image signal obtained from the output terminal $V_{OS}$ contains a charge component (S) and a dark component (D) and an image signal obtained from the output terminal $V_{OD}$ contains only the dark component (D), only the image signal according to the charge component (S) is extracted by the arithmetic processing of the image signals obtained from the output terminals $V_{OS}$, $V_{OD}$ (by subtraction processing ($V_{OS}$–$V_{OD}$)).

The above reading operation for the first row in the periods $t_{11}$ to $t_{15}$ is repeated similarly for the second row and the third row in the periods $t_{21}$ to $t_{25}$ and in the periods $t_{31}$, to $t_{35}$, respectively. Since the photoelectric conversion apparatus shown in FIG. 8 is arranged in such a manner that the reset element 31b is provided for each pixel 31 and the reset drains 4 of all the pixels are arranged in parallel with each other, the reset operation becomes very fast and the total time of the periods $t_{11}$ to $t_{15}$, $t_{21}$ to $t_{25}$, $t_{31}$ to $t_{35}$ becomes shorter than those of the conventional photoelectric conversion apparatus.

Embodiment 8

Figure 10A:
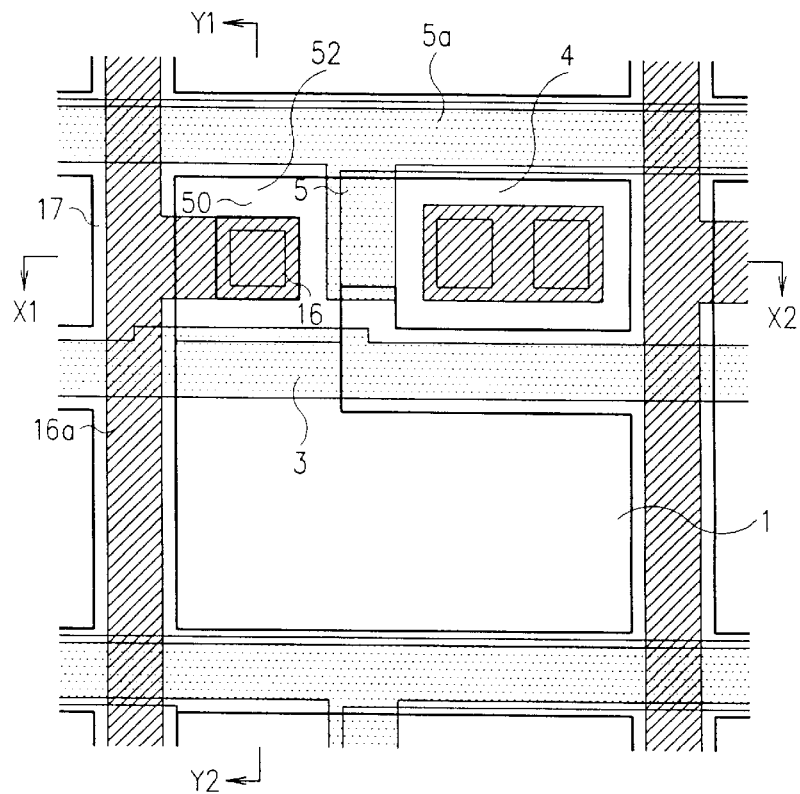
FIGS. 10A to 10C are schematic structural drawings to show the photoelectric conversion element according to Embodiment 8 of the present invention.
Figure 10B:
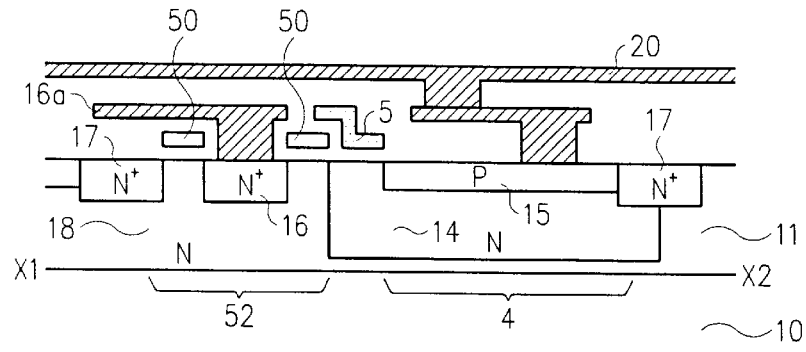
Figure 10C:
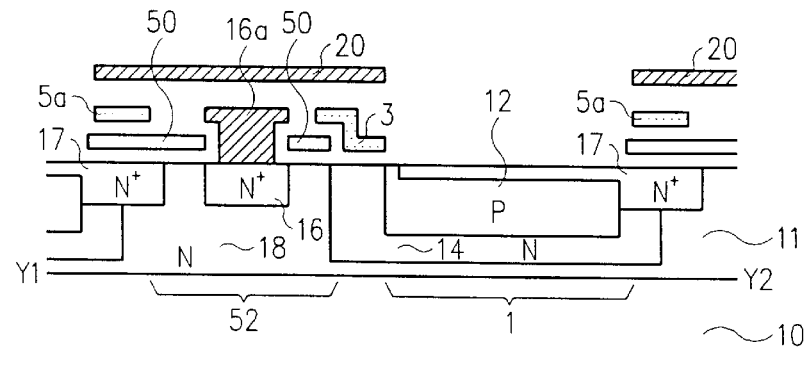

FIGS. 10A–10C are schematic structural drawings to show the photoelectric conversion element according to Embodiment 8 of the present invention, wherein FIG. 10A is a plan view of the schematic structure to show the photoelectric conversion element, FIG. 10B a cross section along X1–X2 line in FIG. 10A, and FIG. 10C a cross section along Y1–Y2 line in FIG. 10A. The photoelectric conversion element according to this Embodiment 8 is different from the above embodiments in that a depletion type MOS transistor 52 is used for the amplifying portion.

The MOS transistor performs so-called non-destructive amplification operation without destroying the charge (signal charge) during amplification operation, similarly as JFET 2, and thus has a property of rarely causing FPN. Further, the MOS transistor has no residual charge in the control region (the surface of silicon (n-type silicon layer) under the gate electrode) upon reset of signal charge, thus having a property of rarely causing lag and reset noise. Accordingly, it is suitable for example for forming a solid state image sensing device capable of performing electronic shutter operation by keeping simultaneity in a frame.

Embodiment 9

Figure 11:
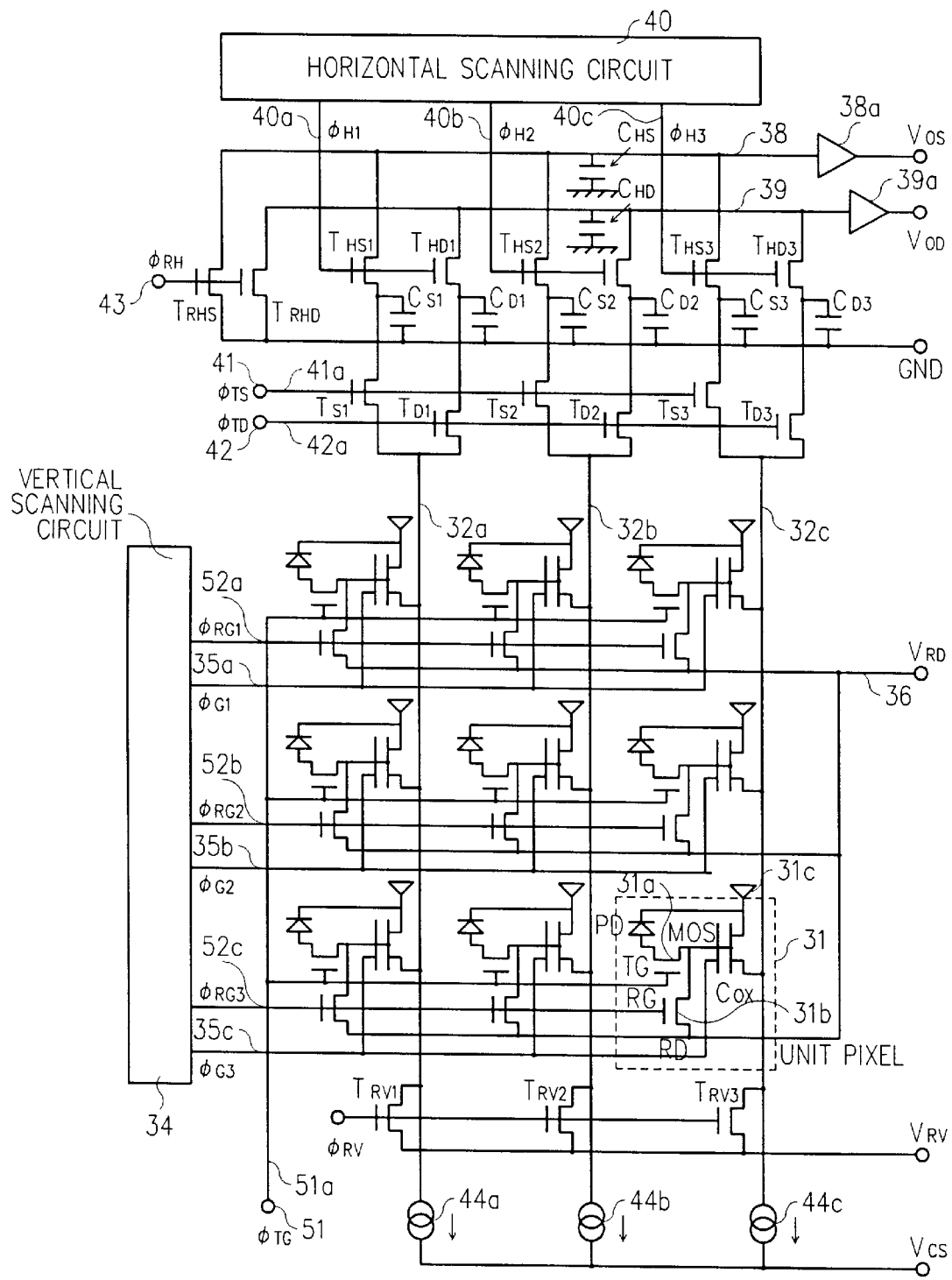
FIG. 11 is a circuit diagram to show a schematic layout of the photoelectric conversion apparatus according to Embodiment 9 of the present invention.

FIG. 11 is a circuit diagram to show the schematic structure of the photoelectric conversion apparatus according to Embodiment 9 of the present invention, in which the photoelectric conversion elements shown in FIGS. 10A–10C are arranged in a two-dimensional matrix. FIG. 12 is a pulse timing chart for explaining the operation of the circuit diagram shown in FIG. 11.

The photoelectric conversion apparatus shown in FIG. 11 is different from the photoelectric conversion apparatus as explained in FIG. 5 (Embodiment 5) and in FIG. 8 (Embodiment 7) in that the amplifying portions of pixels 31 are MOS transistors (MOS), the transfer gates 3 of transfer control elements 31a of all the pixels are connected in common through a row line 51a to the drive pulse generating circuit 51, and the reset gates 5 of the reset elements 31b in each row are arranged to be operated by the drive pulse ($\Phi_{RG1}$–$\Phi_{RG3}$) sent from the vertical scanning circuit 34 through the clock line 52a, 52b, 52c. Employing the arrangement of the photoelectric conversion apparatus shown in FIG. 11, the photoelectric conversion apparatus can realize the electronic shutter operation with simultaneity in a frame.

Now, the operation of the photoelectric conversion apparatus shown in FIG. 11 is explained referring to the pulse timing chart shown in FIG. 12. First, as shown in FIG. 12, in the period $t_{10}$ the drive pulses $\Phi_{TG}$ and $\Phi_{RG1}$–$\Phi_{RG3}$ are changed to the low level, whereby the transfer gates 3 and reset gates 5 of the respective pixels 31 are changed from the non-conductive (off) state into the conductive (on) state.

As a result, not only the control regions of the MOS transistors (MOS) but also the photodiodes 1 are electrically connected to the reset drains 4, whereby the photodiodes 1 are depleted to be initialized and the control regions of the MOS transistors (MOS) are initialized to the potential of the reset drains 4.

Then, in the period $t_{11}$ the drive pulses $\Phi_{TG}$ and $\Phi_{RG1}$–$\Phi_{RG3}$ are changed to the high level to change the transfer gates 3 and reset gates 5 of the respective pixels 31 into the non-conductive (off) state and to bring the photodiodes 1 into a charge storing state. The period $t_{11}$ becomes a shutter time.

Next, in the period $t_{12}$, the drive pulses $\Phi_{RG1}$–$\Phi_{RG3}$ are again set to the low level to change the reset gates 5 of the respective pixels 31 from the non-conductive (off) state to the conductive (on) state. As a result, the potential of the control regions of the MOS transistors (MOS) turn to the potential of the reset drains 4 connected through the row line 36 to the power-supply voltage $V_{RD}$, and dark currents occurring in the MOS transistors (MOS) during the period $t_{11}$ are eliminated, thus again initializing the MOS transistors (MOS). This initialization operation of the MOS transistors (MOS) is a necessary operation for long-term storage in the photodiodes 1 in the case of image pickup in a still picture mode.

In the period $t_{13}$ the drive pulse $\Phi_{TS}$ is set to the high level to change the MOS transistors for transfer of light signal output $T_{S1}$, $T_{S2}$, $T_{S3}$ into the conductive (on) state, the drive pulses $\Phi_{RG1}$–$\Phi_{RG3}$ are set to the high level to turn the reset gates 5 of the respective pixels 31 into the non-conductive (off) state, and the drive pulse $\Phi_{TG}$ is set to the low level to turn the transfer gates 3 of the respective pixels 31 into the conductive (on) state. As a result, the charges generated and stored in the period $t_{11}$ are transferred from the photodiodes 1 to the control regions of MOS transistors.

In the periods $t_{14}$ to $t_{17}$ the reading operation of the pixels 31 in the first row is carried out substantially in the same manner as in the photoelectric conversion apparatus shown in FIG. 5 and FIG. 8. Namely, the operation in the periods $t_{14}$–$t_{17}$ in the photoelectric conversion apparatus shown in FIG. 11 corresponds to the operation in the periods $t_{12}$–$t_{15}$ in the photoelectric conversion apparatus shown in FIG. 5 and FIG. 8.

Namely, in the period $t_{14}$ of the photoelectric conversion apparatus shown in FIG. 10, the drive pulse $\Phi_{G1}$ is set to the high level to raise the potential of the gate electrodes operated by capacitive coupling, and the drive pulse $\Phi_{RV}$ is set to the low level to turn the reset transistors $T_{RV1}$–$T_{RV3}$ into the interrupted state (off), whereby the MOS transistors (MOS) in the first row perform the source-follower operation (charge amplification operation by capacitive load). Here, selection (on) or non-selection (off) of MOS transistors (MOS) in each row is determined by the drive pulses ($\Phi_{G1}$–$\Phi_{G3}$) to the gate electrodes.

During this period $t_{14}$ the drive pulse $\Phi_{TS}$ is already set at the high level so as to keep the MOS transistors for transfer of light signal output $T_{S1}$, $T_{S2}$, $T_{S3}$ in the conductive state (on), and output (signal output) voltages corresponding to potentials after the charges are transferred to the control regions of MOS transistors are stored in the capacitors for storage of light signal output $C_{S1}$, $C_{S2}$, $C_{S3}$.

Next, in the period $t_{15}$, the drive pulse $\Phi_{TD}$ is set to the high level to turn the MOS transistors for transfer of dark output $T_{D1}$, $T_{D2}$, $T_{D3}$ into the conductive state (on), and the drive pulse $\Phi_{RG}$ to the low level to turn the reset gates 5 in the first row into the conductive state (on), whereby the control regions of the MOS transistors (MOS) in the first row are reset (the charges are drained).

Further, in the period $t_{16}$, the drive pulse $\Phi_{RV}$ is again set to the low level to turn the reset transistors $T_{RV1}$–$T_{RV3}$ into the interrupted state (off), and the MOS transistors (MOS) in the first row perform the source-follower operation after reset.

During this period $t_{16}$ the drive pulse $\Phi_{TD}$ is already set at the high level to keep the MOS transistors for transfer of dark output $T_{D1}$, $T_{D2}$, $T_{D3}$ in the conductive state (on), and output (output at dark) voltages corresponding to the potentials after reset of the control regions of MOS transistors (MOS) are stored in the capacitors for storage of dark output $C_{D1}$, $C_{D2}$, $C_{D3}$.

Then in the period $t_{17}$ the drive pulses $\Phi_{G1}$, $\Phi_{TD}$ are set each to the low level and the drive pulse $\Phi_{RV}$ to the high level so as to get ready to output the output voltages (image signals) stored in the capacitors for storage of light signal output $C_{S1}$–$C_{S3}$ and the capacitors for storage of dark output $C_{D1}$–$C_{D3}$ to the output terminals $V_{OS}$, $V_{OD}$. Then sequentially outputting the drive pulses $\Phi_{H1}$–$\Phi_{H3}$ from the horizontal scanning circuit 40 and the drive pulse $\Phi_{RH}$ from the drive pulse generating circuit 43, the image signals stored in the capacitors for storage of light signal output $C_{S1}$–$C_{S3}$ and the capacitors for storage of dark output $C_{D1}$–$C_{D3}$ are transferred to the horizontal reading lines of signal output line 38 and dark output line 39, respectively, then the image signals are output from the terminals $V_{OS}$, $V_{OD}$, while horizontal reading lines of signal output line 38 and dark output line 39 are reset.

The above completes the reading operation of the first row, and the reading operation is then carried out for the second row in the periods $t_{24}$–$t_{27}$ and for the third line in the periods $t_{34}$–$t_{37}$.

The photoelectric conversion apparatus shown in FIG. 11 was explained as to the case of image pickup mainly of still pictures, but the apparatus can be applied to the cases for picking up a moving picture. Namely, the electronic shutter operation can be applied to the cases for picking up the moving picture. However, in the cases for picking up the moving picture, the operation in the periods $t_{10}$–$t_{13}$ shown in FIG. 12 (among which the period $t_{12}$ is not necessary in the case of the moving picture) needs to be performed within the vertical blanking period. Thus, there is a certain limitation on the variable range of shutter speed.

The photoelectric conversion apparatus shown in FIG. 11 (capable of performing the electronic shutter operation with simultaneity in a frame) can employ not only the MOS type photoelectric conversion elements, but also the JFET type or the bipolar type photoelectric conversion elements, as long as they are constructed in the structure operable by capacitive coupling. However, the most preferred elements are the MOS type photoelectric conversion elements causing no reset noise, because the reset operation is interposed between two source-follower operations.

Embodiment 10

Figure 13A:
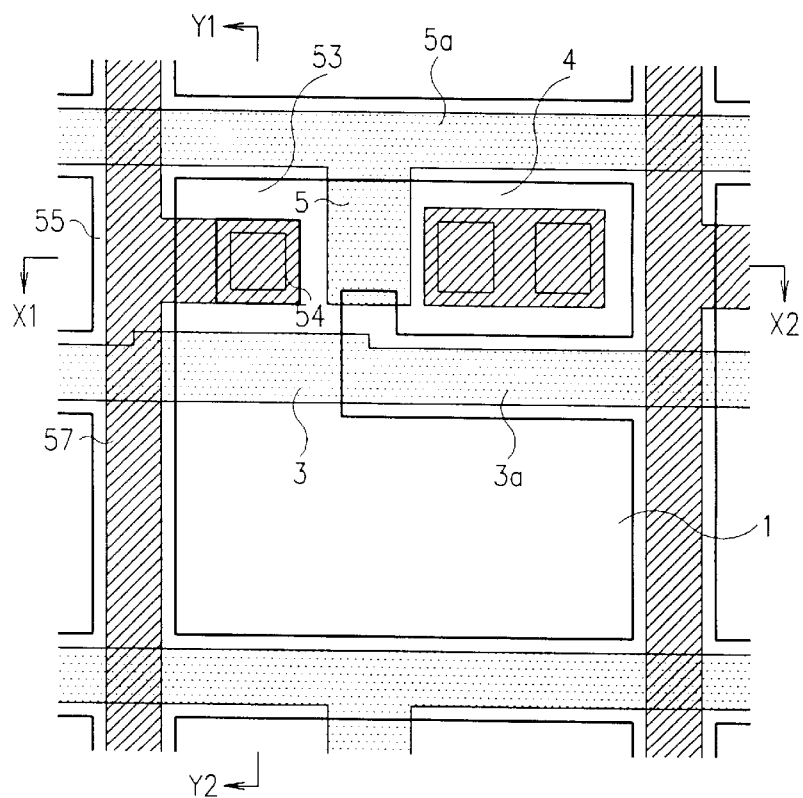
FIGS. 13A to 13C are schematic structural drawings to show the photoelectric conversion element according to Embodiment 10 of the present invention.
Figure 13B:
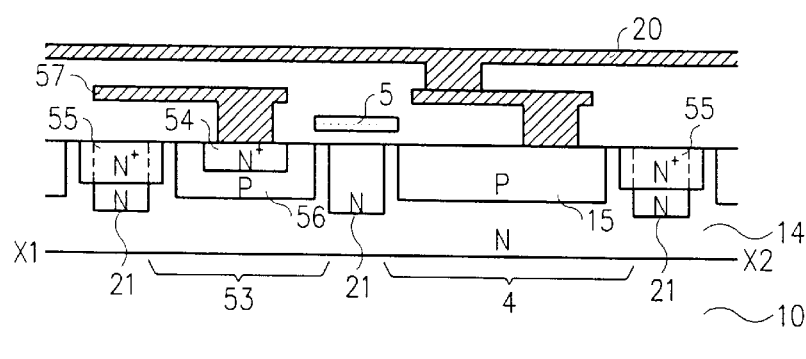
Figure 13C:
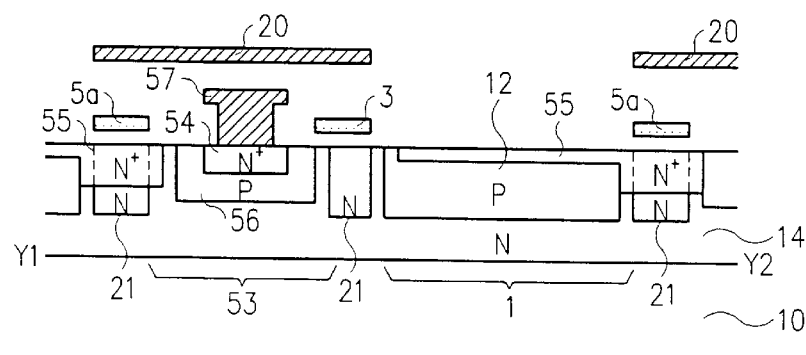

FIGS. 13A to 13C are schematic structural drawings to show the photoelectric conversion element according to Embodiment 10 of the present invention, wherein FIG. 13A is a plan view of the schematic structure to show the photoelectric conversion element, FIG. 13B a cross section along X1–X2 line in FIG. 13A, and FIG. 13C a cross section along Y1–Y2 line in FIG. 13A. The photoelectric conversion element shown in FIGS. 13A to 13C is different from the above embodiments in that a bipolar transistor 53 is used for the amplifying portion. The emitter 54, collector 55, and base 56 are constructed as shown in the drawings, and the emitter electrode 57 and emitter line 58 are formed as shown.

In the bipolar transistor 53 shown in FIGS. 13A to 13C, the collector region is formed in the silicon (n-well region 14) surface layer part without forming the $n^+$-type buried collector or the collector using the high-concentration n-type substrate usually used. This arrangement thus enables the combination of the bipolar transistor 53 with the photodiode 1 in the vertical overflow structure, which can suppress the variations in the output signals due to blooming, smear or the like.

Since Embodiment 10 excludes the electrode for driving the base region by capacitive coupling, the capacitance of the control region becomes small and high sensitivity can be secured.

Embodiment 11

Figure 14A:
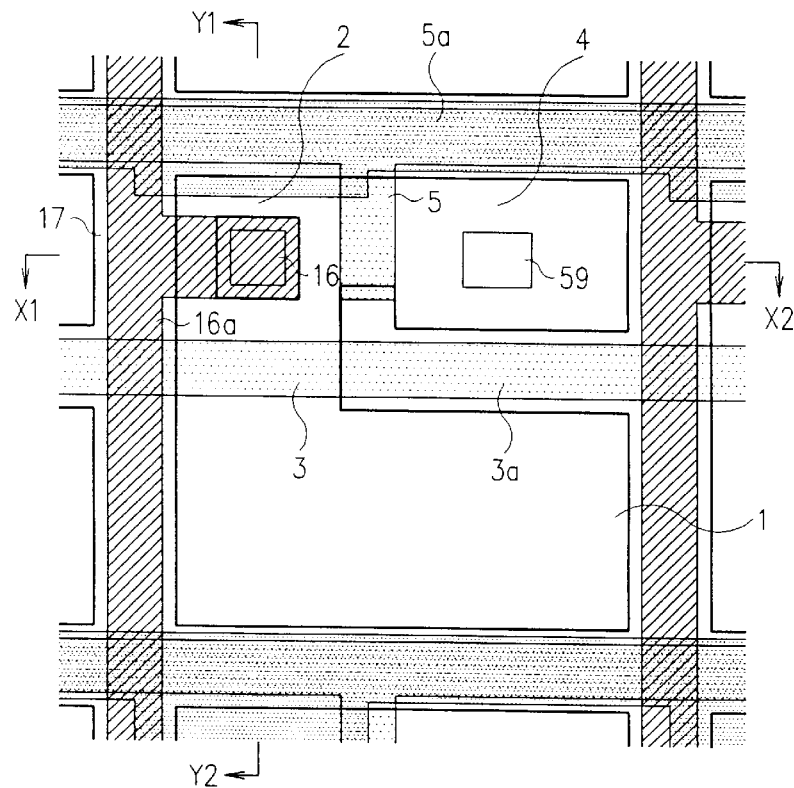
FIGS. 14A to 14C are schematic structural drawings to show the photoelectric conversion element according to Embodiment 11 of the present invention.
Figure 14B:
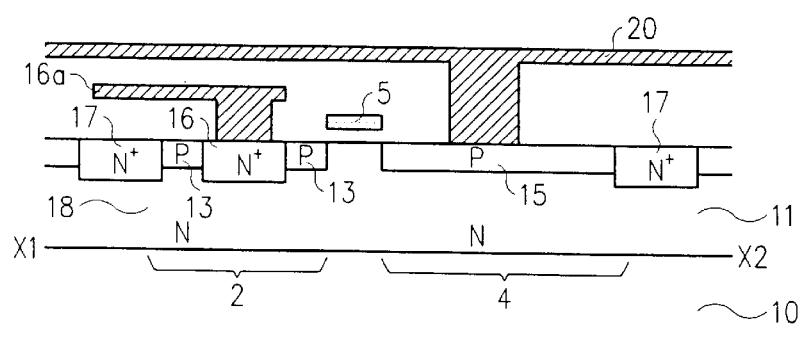
Figure 14C:
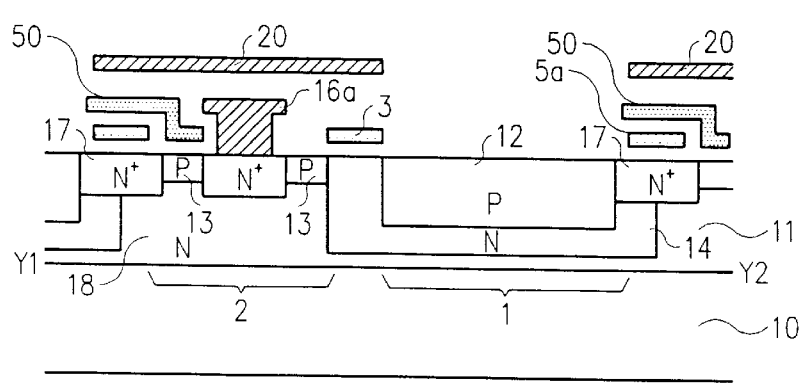

FIGS. 14A to 14C are schematic structural drawings to show the photoelectric conversion element according to Embodiment 11 of the present invention, wherein FIG. 14A is a plan view of the schematic structure to show the photoelectric conversion element, FIG. 14B a cross section along X1–X2 line in FIG. 14A, and FIG. 14C a cross section along Y1–Y2 line in FIG. 14A. In the photoelectric conversion element shown in FIGS. 14A–14C, a metal line connected to the reset-purpose charge draining means (reset drain 4) also serving as a light-shielding film (aluminum film 20) may be connected directly to the p-type reset drain region 15 through a contact hole 59, which is different from FIGS. 1A to 1C in Embodiment 1.

In each of the above embodiments the transfer control element 31a and reset element 31b were explained as MOS type field effect transistors (MOSFETs), but the same effects can be attained when they are formed as bipolar transistors.

As explained above, the photoelectric conversion elements according to the present invention are provided with the reset-purpose charge draining means for draining the charge transferred to the control region of the amplifying portion and the above reset-purpose control means, which presents the effect that the reset operation can be performed without operating the amplifying portion.

This achieves the effect to suppress the variations of the amplification factor due to large transient fluctuations of bias point (operating point) of the amplifying portion with flow of a large current in the amplifying portion itself.

Since the photoelectric conversion elements according to the present invention have the amplifying portion formed of the field effect transistor (FET), they have the effects that the charge (signal charge) is not destroyed in the amplifying operation and occurrence of fixed pattern noise (FPN) can be suppressed.

Further, the photoelectric conversion elements according to the present invention have the effects of increases of the aperture ratio and the degree of integration, because the element isolation region of the predetermined conductivity type is formed between the mutual regions of the photoelectric conversion portion, the amplifying portion, the transfer control portion, the reset-purpose charge draining means, and the reset-purpose control means.

Since in the photoelectric conversion elements according to the present invention the metal interconnection connected to the reset-purpose charge draining means is formed as a light-shielding film for shielding incident light to the amplifying portion, the transfer control portion, the reset-purpose charge draining means, and reset-purpose control means, they also have the effect of suppressing the phenomenon of blur such as blooming due to obliquely incident light.

Since in the photoelectric conversion elements according to the present invention the photoelectric conversion portion is the buried photodiode in the vertical overflow structure, they have the effects of suppressing the phenomenon of blur such as blooming and smear and achieving ideal characteristics by suppressing the dark current, lag, and reset noise.

Since the photoelectric conversion elements according to the present invention are constructed in such a structure that the channel forming portion of the amplifying portion of the photoelectric conversion element is formed of the first conductivity type shallow gate region, the second conductivity type shallow channel region, the first conductivity type gate region, the second conductivity type well region, and the first conductivity type semiconductor substrate in order from the semiconductor surface toward the inside of substrate. Therefore, the elements have the effects that the degree of integration and the aperture ratio can be improved and the sensitivity can be enhanced.

The photoelectric conversion elements according to the present invention are constructed in such a structure that the channel forming portion of the amplifying portion of the photoelectric conversion element is formed of the first conductivity type shallow gate region, the second conductivity type shallow channel region, the first conductivity type gate region, the second conductivity type well region, and the first conductivity type semiconductor substrate in order from the semiconductor surface toward the inside of substrate and that the first conductivity type shallow gate region is electrically connected with the first conductivity type gate region. Therefore, the elements have the effects that the degree of integration and the aperture ratio can be improved and the sensitivity can be enhanced.

As explained above, the photoelectric conversion apparatus according to the present invention is constructed in such an arrangement that the photoelectric conversion elements with the reset-purpose charge draining means for draining the charges transferred to the control regions of the amplifying portions and the above reset-purpose control means are arranged in a two-dimensional matrix, and thus have the effects of suppressing degradation of performance (for example, S/N ratios) of the apparatus and of increasing dissipation power.

The photoelectric conversion apparatus according to the present invention has the effect of performing a high-speed reset operation, because the photoelectric conversion apparatus is constructed in such a manner that the reset-purpose charge draining means of the photoelectric conversion elements arrayed in the horizontal scanning direction are arranged in parallel to each other.

The photoelectric conversion apparatus according to the present invention is constructed in such an arrangement that the apparatus has the first memory means for storing signal outputs for one horizontal line immediately after the control regions of the above amplifying portions are initialized according to vertical scanning and the second memory means for storing signal outputs for one horizontal line immediately after the above charges are transferred to the control regions of the above amplifying portions according to vertical scanning and that the apparatus obtains differences between the signal outputs stored in these memory means. Therefore, the apparatus has the effect that the signal outputs according to only the photogenerated charge components can be obtained.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No. 60034/1995 filed on Feb. 24, 1995 is hereby incorporated by reference.

What is claimed is:

1. A photoelectric conversion element comprising:
   a photoelectric conversion portion for generating a charge according to incident light and storing the charge therein;
   an amplifying portion having a control region for generating a signal output according to the charge received in the gate region from said photoelectric conversion portion;
   a transfer control portion for transferring the charge generated and stored in said photoelectric conversion portion to the control region of said amplifying portion;
   a reset control region for draining the charge transferred to the control region of said amplifying portion; and
   a reset control electrode for controlling the electrical connection between said reset control region and the control region of said amplifying portion,
   wherein said amplifying portion is comprised of a junction field effect transistor having a vertical semiconductor structure composed of a first conductivity type gate region, a second conductivity type channel region, and a first conductivity type semiconductot substrate, in order from the semiconductor surface toward the inside of the semiconductor substrate.

2. A photoelectric conversion element, comprising:
   a photoelectric conversion portion for generating a charge according to incident light and storing the charge therein;
   an amplifying portion having a control region for generating a signal output according to the charge received in the control region from said photoelectric conversion portion;

a transfer control portion for transferring the charge generated and stored in said photoelectric conversion portion to the control region of said amplifying portion;

a reset control region for draining the charge transferred to the control region of said amplifying portion; and a reset control electrode for controlling the electrical connection between said reset control region and the control region of said amplifying portion, wherein said amplifying portion is a junction field effect transistor having a vertical semiconductor structure composed of a first conductivity type shallow gate region, a second conductivity type shallow channel region, a first conductivity type gate region, a second conductivity type well region, and a first conductivity type semiconductor substrate in the order from the semiconductor surface toward the inside of the semiconductor substrate.

3. A photoelectric conversion element, comprising:

a photoelectric conversion portion for generating a charge according to incident light and storing the charge therein;

an amplifying portion having a control region for generating a signal output according to the charge received in the control region from said photoelectric conversion portion;

a transfer control portion for transferring the charge generated and stored in said photoelectric conversion portion to the control region of said amplifying portion;

a reset control region for draining the charge transferred to the control region of said amplifying portion; and a reset control electrode for controlling the electrical connection between said reset control region and the control region of said amplifying portion, wherein said amplifying portion is a junction field effect transistor having a vertical semiconductor structure composed of a first conductivity type shallow gate region, a second conductivity type shallow channel region, a first conductivity type gate region, a second conductivity type well region, and a first conductivity type semiconductor substrate in the order from the semiconductor surface toward the inside of the semiconductor substrate, and wherein said first conductivity type shallow gate region and said first conductivity type gate region are electrically connected with each other in a portion other than the channel forming portion.

4. A photoelectric conversion element, comprising:

a photoelectric conversion portion for generating a charge according to incident light and storing the charge therein;

an amplifying portion having a control region for generating a signal output according to the charge received in the control region from said photoelectric conversion portion;

a transfer control portion for transferring the charge generated and stored in said photoelectric conversion portion to the control region of said amplifying portion;

a reset control region for draining the charge transferred to the control region of said amplifying portion; and a reset control electrode for controlling the electrical connection between said reset control region and the control region of said amplifying portion, wherein said photoelectric conversion portion is a buried photodiode having a vertical overflow structure, wherein said amplifying portion is a junction field effect transistor having a vertical semiconductor structure composed of a first conductivity type shallow gate region, a second conductivity type shallow channel region, a first conductivity type gate region, a second conductivity type well region, and a first conductivity type semiconductor substrate in the order from the semiconductor surface toward the inside of the semiconductor substrate, wherein said first conductivity type shallow gate region and said first conductivity type gate region are electrically connected with each other in a portion other than the channel forming portion, and wherein an impurity concentration of said first conductivity type gate region is different from an impurity concentration of a charge storing portion of said buried photodiode.

5. The photoelectric conversion element according to claim 4, wherein the impurity concentration of said first conductivity type gate region is in the range of $6 \times 10^{15}$ cm$^{-3}$ to $3 \times 10^{16}$ cm$^{-3}$ and the impurity concentration of said charge storing portion of the buried photodiode is in the range of $5 \times 10^{15}$ cm$^{-3}$ to $3 \times 10^{16}$ cm$^{-3}$.

6. A photoelectric conversion apparatus comprising:

a plurality of photoelectric conversion elements arranged in a two-dimensional matrix, each said photoelectric conversion element comprising a photoelectric conversion portion for generating a charge according to incident light and storing the charge therein, an amplifying portion having a control region for generating a signal output according to the charge received in the control region from said photoelectric conversion portion, a transfer control portion for transferring the charge generated and stored in said photoelectric conversion portion to the control region of said amplifying portion, a reset control region for draining the charge transferred to the control region of said amplifying portion, and a reset control electrode for controlling the electrical connection between said reset control region and the control region of said amplifying portion;

a vertical scanning circuit; and a pulse drive source;

wherein each of transfer control portions and reset control regions of said photoelectric conversion elements is respectively connected commonly along a horizontal scanning direction, thereby connecting to said vertical scanning circuit for pulse driving, and wherein a reset control electrode of each of said photoelectric conversion elements is connected commonly to said pulse drive source.

7. A photoelectric conversion apparatus comprising:

a plurality of photoelectric conversion elements arranged in a two-dimensional matrix, each said photoelectric conversion element comprising a photoelectric conversion portion for generating a charge according to incident light and storing the charge therein, an amplifying portion having a control region for generating a signal output according to the charge received in the control region from said photoelectric conversion portion, a transfer control portion for transferring the charge generated and stored in said photoelectric conversion portion to the control region of said amplifying portion reset control region for draining the charge transferred to the control region of said amplifying portion, and a reset control electrode for controlling the electrical connection between said reset control region and the control region of said amplifying portion, and a control means for controlling the control region of said amplifying portion by capacitive coupling;

a vertical scanning circuit;

a pulse drive source; and a power supply;

wherein each of transfer control portions and control means for controlling the control regions of said amplifying portions by capacitive coupling of said photoelectric conversion elements is respectively connected commonly along a horizontal scanning direction, thereby connecting to said vertical scanning circuit for pulse driving, and wherein a reset control electrode and a reset control region of each of said photoelectric conversion elements is respectively connected commonly, such that each of said reset control electrodes is connected to said pulse drive source and each of said reset control regions is connected to said power supply.

8. A photoelectric conversion apparatus comprising:

a plurality of photoelectric conversion elements arranged in a two-dimensional matrix, each said photoelectric conversion element comprising a photoelectric conversion portion for generating a charge according to incident light and storing the charge therein, an amplifying portion having a control region for generating a signal output according to the charge received in the control region from said photoelectric conversion portion, a transfer control portion for transferring the charge generated and stored in said photoelectric conversion portion to the control region of said amplifying portion, a reset control region for draining the charge transferred to the control region of said amplifying portion, a reset control electrode for controlling the electrical connection between said reset control region and the control region of said amplifying portion, and a control means for controlling the control region of said amplifying portion by capacitive coupling;

a vertical scanning circuit;

a pulse drive source; and a power supply;

wherein a control means for controlling the control region of said amplifying portion by capacitive coupling and a reset control electrode of each of said photoelectric conversion elements is respectively connected commonly along a horizontal scanning direction, thereby connecting to said vertical scanning circuit for pulse driving, and wherein each of transfer control portions and reset control regions of each of said photoelectric conversion elements is respectively connected commonly, such that each of said transfer control portions is connected to said pulse drive source and each of said reset control regions is connected to said power supply.

9. A photoelectric conversion apparatus comprising:

a plurality of photoelectric conversion elements arranged in a two-dimensional matrix, each said photoelectric conversion element comprising a photoelectric conversion portion for generating a charge according to incident light and storing the charge therein, an amplifying portion having a control region for generating a signal output according to the charge received in the control region from said photoelectric conversion portion, a transfer control portion for transferring the charge generated and stored in said photoelectric conversion portion to the control region of said amplifying portion, a reset control region for draining the charge transferred to the control region of said amplifying portion, and a reset control electrode for controlling the electrical connection between said reset control region and the control region of said amplifying portion;

a vertical scanning circuit for commonly driving said photoelectric conversion elements along a horizontal scanning direction;

first memory means for storing signal outputs for one horizontal line immediately after control regions of said amplifying portions are initialized according to vertical scanning; and second memory means for storing signal outputs for one horizontal line immediately after said charges are transferred to the control regions of said amplifying portions according to vertical scanning.

* * * * *